(12) United States Patent
Sasaki

(10) Patent No.: US 6,979,410 B2
(45) Date of Patent: Dec. 27, 2005

(54) PIEZOELECTRIC CERAMIC, METHOD OF MANUFACTURING THE SAME AND PIEZOELECTRIC DEVICE

(75) Inventor: Satoshi Sasaki, Yuri-gun (JP)

(73) Assignee: TDK Corporation, Tokyo (JP)

( * ) Notice: Subject to any disclaimer, the term of this patent is extended or adjusted under 35 U.S.C. 154(b) by 94 days.

(21) Appl. No.: 10/472,072

(22) PCT Filed: Mar. 4, 2002

(86) PCT No.: PCT/JP02/01937

§ 371 (c)(1),
(2), (4) Date: Sep. 16, 2003

(87) PCT Pub. No.: WO02/081404

PCT Pub. Date: Oct. 17, 2002

(65) Prior Publication Data

US 2004/0087432 A1 May 6, 2004

(51) Int. Cl.$^7$ .................. C04B 35/49; H01L 41/187
(52) U.S. Cl. .................. 252/62.9 PZ; 501/134; 501/145
(58) Field of Search .................. 252/62.9 PZ; 501/134, 501/135

(56) References Cited

U.S. PATENT DOCUMENTS

| 4,313,839 A | * | 2/1982 | Fesenko et al. ........ 252/62.9 PZ |
| 6,207,069 B1 | | 3/2001 | Furukawa et al. |

FOREIGN PATENT DOCUMENTS

| JP | 44-17344 | 7/1969 |
| JP | 45-26146 | 8/1970 |
| JP | 45-39977 | 12/1970 |
| JP | 50-82596 | 7/1975 |
| JP | 54-3298 | 1/1979 |
| JP | A 58-190871 | 11/1983 |
| JP | A 60-103079 | 6/1985 |
| JP | A 61-129888 | 6/1986 |
| JP | A 64-65070 | 3/1989 |
| JP | A 2-9761 | 1/1990 |
| JP | A 2-145476 | 6/1990 |
| JP | 03-164470 | * 7/1991 |
| JP | A 3-256379 | 11/1991 |
| JP | A 7-315924 | 12/1995 |
| JP | A 8-151264 | 6/1996 |
| JP | A 11-29357 | 2/1999 |
| JP | A 11-92217 | 4/1999 |
| JP | A 2001-97774 | 4/2001 |
| JP | A 2001-181033 | 7/2001 |
| JP | A 2001-181035 | 7/2001 |
| JP | A 2001-181036 | 7/2001 |

OTHER PUBLICATIONS

Derwent abstract for SU 13126, May 30, 1974.*

* cited by examiner

*Primary Examiner*—C. Melissa Koslow
(74) *Attorney, Agent, or Firm*—Oliff & Berridge, PLC

(57) ABSTRACT

Provided are a piezoelectric ceramic and a piezoelectric device having a larger piezoelectric strain constant and capable of being fired at a lower temperature. A main component of $Pb_A[(Mg_{1/3}Nb_{2/3})_a(Zn_{1/3}Nb_{2/3})_bTi_cZr_d]O_3$ ($a+b+c+d=1$, $0.99 \leq A \leq 1.01$, $0.15 \leq a+b \leq 0.5$, $0.05 \leq b \leq 0.25$, $0.2 \leq c \leq 0.5$, $0.15 \leq d \leq 0.6$) and 0.01 mass % to 0.8 mass % inclusive of at least one kind selected from the group consisting of Fe, Co, Ni and Cu in the form of oxide per 1 mol of the main component as a first sub-component are comprised. Thereby, a larger piezoelectric strain constant can be obtained, and a firing temperature can be reduced. In the main component, a part of Pb may be replaced with at least one kind selected from the group consisting of Ca, Sr and Ba. Further, as a second sub-component, 0.05 mass % to 1.0 mass % inclusive of at least one kind selected from the group consisting of Sb, Nb and Ta in the form of oxide per 1 mol of the main component may be comprised.

28 Claims, 3 Drawing Sheets

PIEZOELECTRIC CERAMIC, METHOD OF MANUFACTURING THE SAME AND PIEZOELECTRIC DEVICE

TECHNICAL FIELD

The present invention relates to a piezoelectric ceramic suitable for an actuator, a piezoelectric buzzer, a sound compound, a sensor or the like, a method of manufacturing the same, and a piezoelectric device.

BACKGROUND ART

One of conventional devices using displacement generated by a piezoelectric effect as a mechanical driving source is an actuator. Specifically, compared with an electromagnetic actuator, a multilayer actuator in which a piezoelectric layer and an internal electrode are laminated has lower power consumption, a lower heating value and better responsivity, and the size and weight thereof can be reduced. Therefore, in recent years, the multilayer actuator is used in various fields such as a needle selection control of a fabric-knitting machine.

Piezoelectric ceramics used for these actuators are required to have larger piezoelectric properties, specifically a larger piezoelectric strain constant. As a piezoelectric ceramic capable of obtaining a larger piezoelectric strain constant, for example, a ternary system of lead titanate ($PbTiO_3$; PT), lead zirconate ($PbZrO_3$; PZ) and lead zinc niobate ($Pb(Zn_{1/3}Nb_{2/3})O_3$) is known (refer to Japanese Examined Patent Application Publication No. Sho 44-17344). Further, as an improved ternary system, part of lead (Pb) is replaced with barium (Ba), strontium (Sr), calcium (Ca) or the like to improve a dielectric constant and a mechanical coupling factor (refer to Japanese Examined Patent Application Publication No. Sho 45-39977 and Japanese Unexamined Patent Application Publication No. Sho 61-129888), or the contents of lead, barium and strontium are limited within a specific range to improve variations in properties between products, thereby resulting in an improved piezoelectric strain constant (refer to Japanese Unexamined Patent Application Publication No. Hei 3-256379). Moreover, a quaternary system including lead magnesium niobate ($Pb(Mg_{1/3}Nb_{2/3})O_3$) in addition to the ternary system has been reported (refer to Japanese Unexamined Patent Application Publication No. Hei 8-151264).

However, the firing temperature of a conventional piezoelectric ceramic is as high as 1200° C. or over, so when the piezoelectric layer and the internal electrode are laminated like the multilayer actuator, and then fired, a high-cost noble metal capable of resisting a high temperature of 1200° C. or over such as platinum (Pt) or palladium (Pd) must be used, which causes a problem in its manufacturing cost. Further, in order to reduce the firing temperature, a step of forming powders with a large specific surface area after pre-firing, or a step of applying pressure during firing must be carried out, which causes its manufacturing process to be complicated.

As a less expensive material of the internal electrode, a silver-palladium alloy (Ag—Pd alloy) is known. However, when the palladium content exceeds 30 mass %, palladium induces a reduction reaction during firing, which may cause a defect such as the occurrence of a crack or peeling of the electrode. Therefore, the palladium content is preferably 30 mass % or less. In order to contain 30 mass % or less of palladium, according to the phase diagram of the silver-palladium system, the firing temperature is required to be 1150° C. or less, preferably 1120° C. or less. Moreover, in order to reduce the manufacturing cost, it is necessary to further reduce the palladium content. For that purpose, the firing temperature is required to be as low as possible. For example, in order to contain 20 mass % or less of palladium, the firing temperature is required to be 1050° C. or less, preferably 1000° C. or less.

Moreover, in recent years, the development of smaller size and lower profile actuators, such as a study of the use of much smaller size actuators than the conventional one called micro-actuators for controlling the positioning of hard disk heads, have been increasingly advanced.

However, as the displacement of the actuator using the piezoelectric ceramic is proportional to the volume thereof, when the size of the actuator is simply reduced, the displacement thereof is also reduced. In order to reduce the size of the actuator without reducing the displacement, it is required to increase the number of layers to laminate or to use a piezoelectric ceramic having a larger piezoelectric strain constant. However, when the number of layers increases, the amount of the material required for the internal electrode and the number of manufacturing steps increase, thereby resulting in increased cost, and further thinner layers must be achieved, so it is not preferable. Therefore, a piezoelectric ceramic having a further larger piezoelectric strain constant is required. For example, the piezoelectric strain constant $d_{33}$ in a thickness longitudinal vibration mode is 550 pC/N or over, and preferably 600 pC/N or over.

In addition, as advances in size and profile of a piezoelectric device make the mechanical strength of the device decline, the device is prone to be damaged during manufacturing and using, and to lead a decline in yield and deterioration in properties. Therefore, a larger mechanical strength is required.

Moreover, the piezoelectric ceramic for the actuator is required to have a larger piezoelectric strain constant as well as a higher Curie temperature and to suffer a smaller deterioration in piezoelectric properties with time. For example, in recent years, actuators for driving a hard disk head of a personal computer or the like used at a high temperature of approximately 100° C. or 150° C. have been increasing, so piezoelectric ceramics applicable to such actuators are desired to have a Curie temperature of 200° C. or over, preferably 300° C. or over. Further, in recent years, the actuators are more often used to control more accurate positioning than before, so a smaller deterioration in piezoelectric properties with time is required. In such a case, the piezoelectric strain constant $d_{31}$ in a rectangular extensional vibration mode is preferably 200 pC/N or over. In the conventional piezoelectric ceramic, a larger piezoelectric strain constant can be obtained, but there is a problem that the Curie temperature is low or the deterioration in piezoelectric properties with time is large.

In view of the foregoing, it is an object of the present invention to provide a piezoelectric ceramic having superior properties such as a higher piezoelectric strain constant and capable of being fired at a lower temperature, a method of manufacturing the same, and a piezoelectric device.

DISCLOSURE OF THE INVENTION

A first piezoelectric ceramic according to the invention comprises an oxide represented by Chemical Formula 1 as a main component and 0.01 mass % to 0.8 mass % inclusive of at least one kind selected from the group consisting of iron (Fe), cobalt (Co), nickel (Ni) and copper (Cu) in the form of oxide ($Fe_2O_3$, CoO, NiO, CuO) per 1 mol of the main component as a first sub-component.

A second piezoelectric ceramic according to the invention comprises an oxide represented by Chemical Formula 2 as a main component and 0.01 mass % to 0.8 mass % inclusive of at least one kind selected from the group consisting of iron, cobalt, nickel and copper in the form of oxide ($Fe_2O_3$, $CoO$, $NiO$, $CuO$) per 1 mol of the main component as a first sub-component.

In the first and the second piezoelectric ceramics according to the invention, the oxide represented by Chemical Formula 1 or Chemical Formula 2 as the main component and a predetermined amount of at least one kind selected from the group consisting of iron, cobalt, nickel and copper as the first sub-component are comprised, so the piezoelectric strain constant can be larger, and the firing temperature can be reduced.

Moreover, 0.05 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component may be comprised as a second sub-component.

Further, 0.01 mass % to 0.1 mass % inclusive of at least one kind selected from the group consisting of sodium (Na) and potassium (K) in the form of oxide ($Na_2O$, $K_2O$) per 1 mol of the main component may be comprised as a third sub-component.

A first method of manufacturing a piezoelectric ceramic according to the invention comprises the step of pressing and firing a mixture of elements constituting a main component represented by Chemical Formula 1 and 0.01 mass % to 0.8 mass % inclusive of at least one kind selected from the group consisting of iron, cobalt, nickel and copper in the form of oxide ($Fe_2O_3$, $CoO$, $NiO$, $CuO$) per 1 mol of the main component as a first sub-component.

A second method of manufacturing a piezoelectric ceramic according to the invention comprises the step of pressing and firing a mixture of elements constituting a main component represented by Chemical Formula 2 and 0.01 mass % to 0.8 mass % inclusive of at least one kind selected from the group consisting of iron, cobalt, nickel and copper in the form of oxide ($Fe_2O_3$, $CoO$, $NiO$, $CuO$) per 1 mol of the main component as a first sub-component.

In the first and the second method of manufacturing a piezoelectric ceramics according to the invention, a mixture of elements constituting the main component represented by Chemical Formula 1 or Chemical Formula 2 and a predetermined amount of at least one kind selected from the group consisting of iron, cobalt, nickel and copper as the first sub-component is pressed and fired, so even if the piezoelectric ceramic is fired at a lower temperature, the piezoelectric ceramic having a larger piezoelectric strain constant can be obtained.

Moreover, at this time, it is preferable that pre-fired powder containing the main component and the first sub-component is pressed and fired. Further, 0.05 mass % to 1.0 mass % inclusive of at least one kind selected from the group consisting of antimony, niobium and tantalum in the form of oxide ($Sb_2O_3$, $Nb_2O_5$, $Ta_2O_5$) per 1 mol of the main component as a second sub-component may be added to the mixture, and at this time, it is preferable to press and fire pre-fired powder containing the main component, the first sub-component and the second sub-component.

Further, pre-fired powder containing the main component and 0.01 mass % to 0.1 mass % inclusive of at least one kind selected from the group consisting of sodium and potassium in the form of oxide ($Na_2O$, $K_2O$) per 1 mol of the main component as a third sub-component may be prepared.

A first piezoelectric device according to the invention comprises the first or the second piezoelectric ceramic according to the invention.

A third piezoelectric ceramic according to the invention comprises an oxide represented by the Chemical Formula 5 as a main component and 0.1 mass % to 1.0 mass % inclusive of at least one kind selected from the group consisting of antimony, niobium and tantalum in the form of oxide ($Sb_2O_3$, $Nb_2O_5$, $Ta_2O_6$) per 1 mol of the main component as a sub-component.

In the third piezoelectric ceramic according to the invention, the oxide represented by Chemical Formula 5 as the main component and a predetermined amount of at least one kind selected from the group consisting of antimony, niobium and tantalum as the sub-component are comprised, so the piezoelectric strain constant and the Curie temperature thereof can be higher, and deterioration in the properties with time can be small, and the firing temperature can be reduced.

A second piezoelectric device according to the invention comprises the third piezoelectric ceramic according to the invention.

A fourth piezoelectric ceramic according to the invention comprises an oxide represented by Chemical Formula 3 as a main component, 0.01 mass % to 0.8 mass % inclusive of at least one kind selected from the group consisting of iron, cobalt, nickel and copper in the form of oxide ($Fe_2O_3$, $CoO$, $NiO$, $CuO$) per 1 mol of the main component as a first sub-component, and 0.1 mass % to 1.0 mass % inclusive of at least one kind selected from the group consisting of antimony, niobium and tantalum in the form of oxide ($Sb_2O_3$, $Nb_2O_5$, $Ta_2O_5$) per 1 mol of the main component as a second sub-component.

A fifth piezoelectric ceramic according to the invention comprises an oxide represented by Chemical Formula 4 as a main component, 0.01 mass % to 0.8 mass % inclusive of at least one kind selected from the group consisting of iron, cobalt, nickel and copper in the form of oxide ($Fe_2O_3$, $CoO$, $NiO$, $CuO$) per 1 mol of the main component as a first sub-component and 0.1 mass % to 1.0 mass % inclusive of at least one kind selected from the group consisting of antimony, niobium and tantalum in the form of oxide ($Sb_2O_3$, $Nb_2O_5$, $Ta_2O_5$) per 1 mol of the main component as a second sub-component.

In the fourth and the fifth piezoelectric ceramics according to the invention, the oxide represented by Chemical Formula 3 or Chemical Formula 4 as the main component, a predetermined amount of at least one kind selected from the group consisting of iron, cobalt, nickel and copper as the first sub-component, and a predetermined amount of at least one kind selected from the group consisting of antimony, niobium and tantalum as the second sub-component are comprised, so the piezoelectric strain constant and the mechanical strength can be larger and the firing temperature can be reduced.

A third piezoelectric device according to the invention comprises the fourth or the fifth piezoelectric ceramic according to the invention.

Other and further objects, features and advantages of the invention will appear more fully from the following description.

BEST MODE FOR CARRYING OUT THE INVENTION

Figure 1:
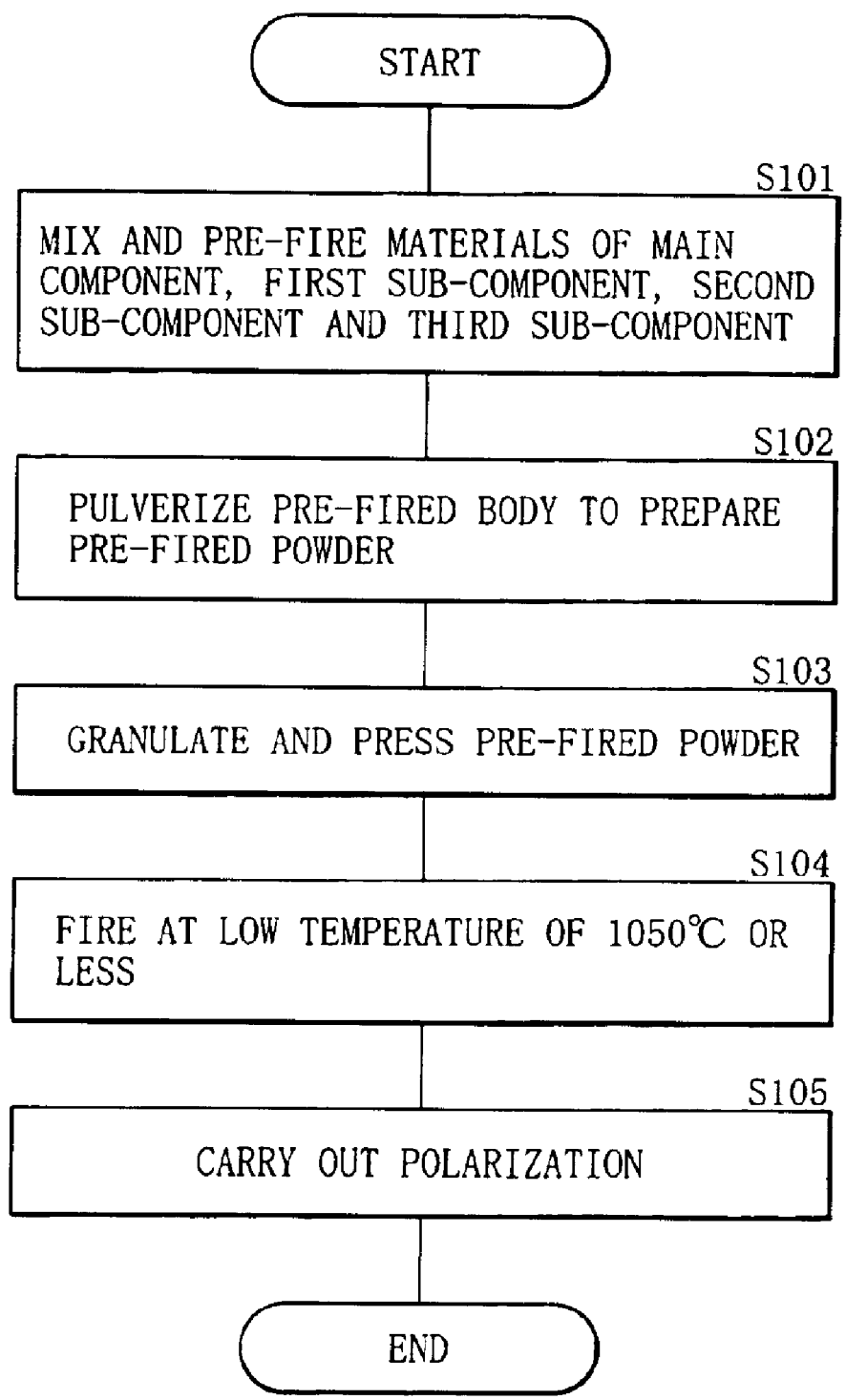
FIG. 1 is a flow chart showing a method of manufacturing a piezoelectric ceramic according to a first embodiment of the invention.

Preferred embodiments of the present invention are described in more detail below. All Chemical Formulas and Tables are listed herein at the end of the specification.

[First Embodiment]

A piezoelectric ceramic according to a first embodiment of the invention comprises an oxide represented by Chemical Formula 8 or Chemical Formula 2 as a main component.

In Chemical Formula 1, the values of A, a, b, c and d are within a range satisfying $a+b+c+d=1$, $0.99 \leq A \leq 1.01$, $0.15 \leq a+b \leq 0.5$, $0.05 \leq b \leq 0.25$, $0.2 \leq c \leq 0.5$, $0.15 \leq d \leq 0.6$, respectively. The composition of magnesium and niobium in $(Mg_{1/3}Nb_{2/3})$, the composition of zinc and niobium in $(Zn_{1/3}Nb_{2/3})$ and the composition of oxygen are stoichiometrically determined, and they may deviate from the stoichiometric composition.

Moreover, in Chemical Formula 2, the values of A, B, a, b, c and d are within a range satisfying $a+b+c+d=1$, $0.99 \leq A \leq 1.01$, $0.005 \leq B \leq 0.1$, $0.15 \leq a+b \leq 0.5$, $0.05 \leq b \leq 0.25$, $0.2 \leq c \leq 0.5$, $0.15 \leq d \leq 0.6$, respectively. Me represents at least one kind selected from the group consisting of calcium, strontium and barium. The composition of magnesium and niobium in $(Mg_{1/3}Nb_{2/3})$, the composition of zinc and niobium in $(Zn_{1/3}Nb_{2/3})$ and the composition of oxygen are stoichiometrically determined, and they may deviate from the stoichiometric composition.

The oxide represented by Chemical Formula 1 or Chemical Formula 2 has a perovskite structure, in which lead and at least one kind selected from the group consisting of calsium, strontium and barium are positioned at the so-called A-site and magnesium (Mg), niobium (Nb), zinc (Zn), titanium (Ti) and zirconium (Zr) are positioned at the so-called B-site.

Moreover, the oxide represented by Chemical Formula 2 contains at least one kind selected from the group consisting of calcium, strontium and barium instead of a part of lead in the oxide represented by Chemical Formula 1 so as to be capable of further improving the piezoelectric strain constant. The value of B in Chemical Formula 2, that is, the amount of at least one kind selected from the group consisting of calcium, strontium and barium is 0.005 or over. It is because if the value is less than 0.005, the piezoelectric strain constant cannot be sufficiently improved. Also, the reason that the value is 0.1 or less is because if the value exceeds 0.1, the sinterability declines, and thereby the piezoelectric strain constant becomes small.

The composition A of lead in Chemical Formula 1 or the composition A of lead and at least one kind selected from the group consisting of calcium, strontium and barium in Chemical Formula 2 is a factor which has an influence on sinterability. Further, the composition A is the composition ratio of an element positioned at the so-called A-site when the composition of $[(Mg_{1/3}Nb_{2/3})_a Zn_{1/3}Nb_{2/3})_b Ti_c Zr_d]$ that is positioned at the so-called B-site is 1. The value of A is 0.99 or over, because if the value is less than 0.99, firing at a relatively low temperature is difficult, and, for example, sintering at a firing temperature of 1050° C. or less is difficult. Further, the value of A is 1.01 or less, because if the value exceeds 1.01, the sinterability declines, and thereby sufficient piezoelectric properties cannot be obtained.

Magnesium and niobium $((Mg_{1/3}Nb_{2/3})$ in Chemical Formula 1 or Chemical Formula 2 are factors to further improve the piezoelectric properties, specifically the piezoelectric strain constant, and zinc and niobium $(Zn_{1/3}Nb_{2/3})$ are factors to reduce the firing temperature while maintaining the properties.

The sum of the composition a of magnesium and niobium $((Mg_{1/3}Nb_{2/3})$ and the composition b of zinc and niobium $(Zn_{1/3}Nb_{2/3})$ is within a range from 0.15 to 0.5 inclusive, because if the sum is less than 0.15, a sufficient effect by adding cannot be obtained, and if the sum exceeds 0.5, a large amount of expensive niobium oxide must be used, so the manufacturing cost increases, and a pyrochlore phase which is a hetero-phase is prone to be produced, thereby it is difficult to synthesize. Moreover, the composition b of zinc and niobium $(Zn_{1/3}Nb_{2/3})$ is within a range from 0.05 to 0.25 inclusive, because if it is less than 0.05, a sufficient effect of reducing the firing temperature cannot be obtained, and if it exceeds 0.25, the piezoelectric strain constant becomes small.

The composition c of titanium (Ti) and the composition d of zirconium (Zr) in Chemical Formula 1 or Chemical Formula 2 are factors to increase the piezoelectric strain constant. The composition c of titanium is within a range from 0.2 to 0.5 inclusive, and the composition d of zirconium is within a range 0.15 to 0.6 inclusive, because a larger piezoelectric strain constant can be obtained in the vicinity of such a morphotropic phase boundary (MPB).

The piezoelectric ceramic comprises 0.01 mass % to 0.8 mass % inclusive of at least one kind selected from the group consisting of iron, cobalt, nickel and copper as a first sub-component in the form of oxide ($Fe_2O_3$, CoO, NiO, CuO) per 1 mol of the main component represented by Chemical Formula 1 or Chemical Formula 2. The first sub-component is provided to improve the sinterability so that the firing temperature can be further reduced. The content of the first sub-component is within a range from 0.01 mass % to 0.8 mass % inclusive in the form of oxide per 1 mol of the main component, because if the content is less than 0.01 mass %, the sinterability cannot be sufficiently improved, and if the content exceeds 0.8 mass %, contrarily, the sinterability declines.

Further, it is preferable that the piezoelectric ceramic comprises 0.05 mass % to 1.0 mass % inclusive of at least one kind selected from the group consisting of antimony, niobium and tantalum as a second sub-component in the form of oxide ($Sb_2O_3$, $Nb_2O_5$, $Ta_2O_5$) per 1 mol of the main component represented by Chemical Formula 1 or Chemical Formula 2. The second sub-component is provided to improve the properties, while maintaining a low firing temperature. The content of the second sub-component is within a range from 0.05 mass % to 1.0 mass % inclusive in the form of oxide per 1 mol of the main component, because if the content is less than 0.05 mass %, a sufficient effect by adding the second sub-component cannot be obtained, and if the content exceeds 1.0 mass %, the sinterability declines, thereby resulting in declined piezoelectric properties.

Still further, it is preferable that the piezoelectric ceramic comprises 0.01 mass % to 0.1 mass % inclusive of at least one kind selected from the group consisting of sodium and potassium as a third sub-component in the form of oxide ($Na_2O$, $K_2O$) per 1 mol of the main component represented by Chemical Formula 1 or Chemical Formula 2. The third sub-component is provided to reduce the firing temperature. The content of the third sub-component is within a range from 0.01 mass % to 0.1 mass % inclusive inclusive in the form of oxide per 1 mol of the main component, because if the content is less than 0.01 mass %, a sufficient effect by adding the third sub-component cannot be obtained, and if the content exceeds 1.0 mass %, the sinterability and the insulation resistance decline, thereby it is difficult to polarize.

The first sub-component, the second sub-component and the third sub-component in the form of solid solution are contained in the oxide of the main component. The first sub-component and the second sub-component are positioned at the so-called B-site where titanium and zirconium can be held, and the third sub-component is positioned at the so-called A-site where lead can be held. Further, either or both of the second sub-component and the third sub-component may be contained as required.

The piezoelectric ceramic having such a configuration can be manufactured through, for example, the following steps.

FIG. 1 is a flow chart showing a method of manufacturing the piezoelectric ceramic. At first, as the materials of the main component, for example, lead oxide (PbO) powder, titanium oxide ($TiO_2$) powder, zirconium oxide ($ZrO_2$) powder, zinc oxide (ZnO) powder, niobium oxide ($Nb_2O_5$) powder and magnesium oxide (MgO) powder are prepared, and at least one kind selected from the group consisting of calcium carbonate ($CaCO_3$) powder, strontium carbonate ($SrCO_3$) powder and barium carbonate ($BaCO_3$) powder are prepared as required.

As the material of the first sub-component, for example, at least one kind selected from the group consisting of iron oxide ($Fe_2O_3$) powder, cobalt oxide (CoO) powder, nickel oxide (NiO) powder and copper oxide (CuO) powder is prepared. Further, as the material of the second sub-component, for example, at least one kind selected from the group consisting of antimony oxide ($Sb_2O_3$) powder, niobium oxide powder and tantalum oxide ($Ta_2O_5$) powder is prepared as required, and as the material of the third sub-component, for example, at least one kind selected from the group consisting of sodium carbonate ($Na_2CO_3$) powder and potassium carbonate ($K_2CO_3$) powder is prepared as required.

Incidentally, as the materials of the main component, the first sub-component, the second sub-component and the third sub-component, materials which become oxides through firing such as carbonate, oxalate or a hydroxide may be used instead of the oxides, and an oxide or any other material which become an oxide through firing may be used instead of carbonate.

Next, after these materials are sufficiently dried, the materials are weighed so that the final composition is within the aforementioned range. The materials of the main component and the first sub-component, and optionally the materials of the second sub-component and/or the third sub-component are sufficiently mixed in an organic solvent or water by a ball mill or the like, dried, and then pre-fired for 2 hours to 8 hours at 750° C. to 850° C. (step S101). Alternatively, the first sub-component and the second sub-component may be added after pre-firing, although it is preferable that they are added before pre-firing, because a more homogenous piezoelectric ceramic can be produced. When the first sub-component and the second sub-component are added before pre-firing, carbonate, oxalate, a hydroxide or the like which becomes an oxide through firing may be used as the materials, however, when they are added after pre-firing, oxides are preferably used. On the other hand, even if the third sub-component is added after pre-firing, an effect of reducing the firing temperature cannot be obtained, so the third sub-component is required to be added before pre-firing.

Then, for example, the pre-fired body is sufficiently pulverized by the ball mill or the like in an organic solvent or water to prepare pre-fired powder containing the main component and the first sub-component, and optionally the second sub-component and/or the third sub-component (step S102). After that, the pre-fired powder is dried, and, for example, a polyvinyl alcohol-based binder is added to the pre-fired powder, and the pre-fired powder with the binder is granulated, and then pressed by the use of a uniaxial pressing apparatus, a cold isostatic pressing (CIP) apparatus or the like (step S103). After pressing, the pressed body is fired under air atmosphere preferably at 1050° C. or less, for example, at a low temperature ranging from 900° C. to 1050° C. for 2 hours to 6 hours (step S104). Although the pressed body may be fired at a higher temperature than 1050° C. the pressed body can be sufficiently sintered at a low temperature of 1050° C. or less, and can obtain superior properties. In addition, the firing atmosphere may have a higher oxygen partial pressure than air atmosphere, or may be a pure oxygen atmosphere. After firing, the obtained sintered body is polished as required, and an electrode for polarization is formed, then an electric field is applied to the sintered body in heated silicon oil to carry out polarization (step S105). Then, the electrode for polarization is removed to obtain the above piezoelectric ceramic.

Such a piezoelectric ceramic is preferably used for the material of a piezoelectric device such as an actuator, a piezoelectric buzzer, a sound compound and a sensor, specifically the material of the actuator.

Figure 2:
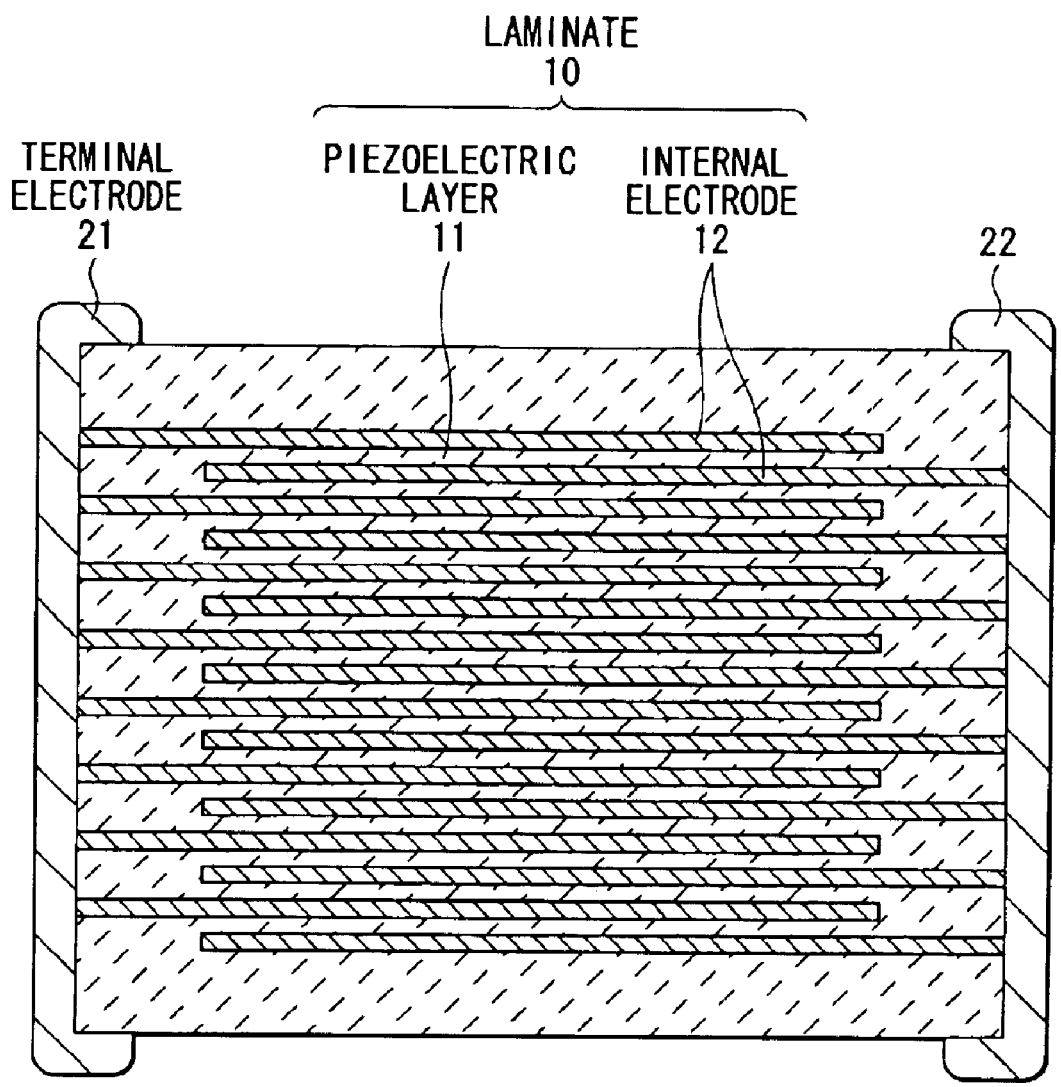
FIG. 2 is a sectional view of an example of the configuration of a piezoelectric device using the piezoelectric ceramic according to the first embodiment of the invention.

FIG. 2 shows an example of the configuration of a piezoelectric device using the piezoelectric ceramic according to the embodiment. The piezoelectric device comprises a laminate 10 including a plurality of piezoelectric layers 11 made of, for example, the piezoelectric ceramic according to the embodiment and a plurality of internal electrodes 12 which are alternately laminated. Each of the piezoelectric layers 11 preferably has a thickness of approximately 1 $\mu$m to 100 $\mu$m, and the number of the piezoelectric layers 11 is determined depending upon a target amount of displacement.

The internal electrodes 12 contain an electrically conductive material. The electrically conductive material is not specifically limited, but for example, at least one kind selected from the group consisting of silver (Ag), gold (Au), platinum and palladium or an alloy thereof is preferable. Specifically, in the embodiment, the piezoelectric layers 11 can be fired at as a low temperature as, for example, 1050° C. or less, so the internal electrodes 12 can be made of a relatively low-cost material such as a silver-palladium alloy containing a small amount of palladium.

The internal electrodes 12 may contain approximately 0.1 mass % or less of various minor components such as phosphorus (P) in addition to these electrically conductive materials. Each of the internal electrodes 12 preferably has a thickness of approximately 0.5 $\mu$m to 0.3 $\mu$m, for example. If the thickness is thinner than 0.5 $\mu$m, the internal electrodes 12 may be broken, therefore, sufficient piezoelectric properties cannot be obtained, and if the thickness is thicker than 3 $\mu$m, a distortion of the laminate 10 after firing may become larger.

For example, the internal electrodes 12 are alternately extended in the opposite directions, and a pair of terminal electrodes 21 and 22 electrically connected with the internal electrodes 12 are disposed in the both extending directions, respectively. The terminal electrodes 21 and 22 may be formed, for example, through sputtering a metal such as gold, or through baking a paste for the terminal electrodes. The paste for the terminal electrodes includes, for example, an electrically conductive material, a glass frit and a vehicle, and the electrically conductive material preferably includes, for example, at least one kind selected from the group consisting of silver, gold, copper, nickel, palladium and platinum. The vehicle includes an organic vehicle, a water-based vehicle or the like, and the organic vehicle is a binder dissolving in an organic solvent, and the water-based vehicle is a water-soluble binder, a dispersant and so on dissolving in water. The thicknesses of the terminal electrodes 21 and 22 are determined depending upon applications, etc. as required, however, they are typically approximately 10 $\mu$m to 50 $\mu$m.

Moreover, the electrical connection between the internal electrodes 12 and an external power source (not shown) may not be carried out through the terminal electrodes 21 and 22, for example, a through hole (via hole) may be bored through the internal electrodes 12 in the laminating direction so as to connect the internal electrodes 12 with a terminal of the external power source (not shown).

The piezoelectric device can be manufactured through the following steps. At first, pre-fired powder is prepared in the same manner as the aforementioned method of manufacturing the piezoelectric ceramic, and the vehicle is added to the pre-fired powder, then the pre-fired powder with the vehicle is mixed and kneaded to prepare a paste for the piezoelectric layer. Next, the aforementioned electrically conductive materials, various oxides which become the aforementioned electrically conductive material after firing, organic metal compounds or resinates for forming the internal electrode 12 are mixed and kneaded with the vehicle to prepare a paste for the internal electrode. In addition, an additive such as a dispersant, a plasticizer, a dielectric material and an insulating material may be optionally added to the paste for the internal electrode.

Then, the paste for the piezoelectric layer and the paste for the internal electrode are used to prepare a green chip which is a precursor of the laminate 10 through, for example, a printing method or a sheet method. After that, the binder is removed from the green chip, and the green chip is fired to form the laminate 10. The firing temperature is preferably a low temperature of, for example, 1050° C. or less, in the same manner as the aforementioned method of manufacturing the piezoelectric ceramic, because a low-cost silver-palladium alloy or the like can be used for the internal electrode 12.

After the laminate 10 is formed, end faces of the laminate 10 are polished through, for example, barrel-polishing or sandblasting, and a metal such as gold or the like is sputtered or a paste for the terminal electrode prepared in the same manner as the paste for the internal electrode is printed or transferred and baked so as to form the terminal electrodes 21 and 22. Thereby, the piezoelectric device shown in FIG. 2 can be obtained.

Thus, according to the embodiment, the oxide represented by the Chemical Formula 1 or the Chemical Formula 2 as the main component and a predetermined amount of at least one kind selected from the group consisting of iron, cobalt nickel and copper as the first sub-component are comprised, so a larger piezoelectric strain constant can be obtained, and the firing, temperature can be as low as 1050° C. or less. Therefore, when, for example, the multilayer piezoelectric device shown in FIG. 2 is formed, a low-cost material such as a silver-palladium alloy containing a small amount of palladium can be used for the internal electrode 12, thereby piezoelectric device which is lower-cost cost and smaller in size than the conventional one can be obtained.

More specifically, when the oxide represented by the Chemical Formula 2 is the main component, a part of lead is replaced with at least one kind selected from the group consisting of calcium, strontium and barium, therefore a larger piezoelectric strain constant can be obtained.

Moreover, when a predetermined amount of at least one kind selected from the group consisting of antimony, niobium and tantalum is comprised as the second sub-component, while the firing temperature is maintained low, the properties can be further improved.

Further, when a predetermined amount of at least one kind selected from the group consisting of sodium and potassium is comprised as the third sub-component, the firing temperature can be reduced to, for example, 1000° C. or less.

[Second Embodiment]

A piezoelectric ceramic according to a second embodiment of the invention comprises an oxide represented by Chemical Formula 5 as the main component.

In Chemical Formula 5, the values of A, B, a, b, c and d are within a range satisfying a+b+c+d=1, $0.99 \leq A/B \leq 1.005$, $0.005 \leq a \leq 0.03$, $0.05 \leq b \leq 0.2$, $0.36 \leq c \leq 0.49$, $0.39 \leq d \leq 0.48$, respectively. The composition of cobalt and niobium in ($Co_{1/3}Nb_{2/3}$), the composition of zinc and niobium in ($Zn_{1/3}Nb_{2/3}$) and the composition of oxygen are stoichiometrically determined, and they may deviate from the stoichiometric composition.

The oxide represented by Chemical Formula 5 has a perovskite structure, and lead is positioned at the so-called A-site, and cobalt (Co), niobium, zinc, titanium and zirconium are positioned at the so-called B-site.

A/B in Chemical Formula 5 is a factor which has an influence on sinterability. The value of A/B is 0.99 or over, because if the value is less than 0.99, it is difficult to fire at a relatively low temperature, for example, if the firing temperature is 1050° C. or less, sufficient values of density, piezoelectric strain constant and mechanical quality factor cannot be obtained due to inadequate sintering. Further, the value of A/B is 1.005 or less, because if the value exceeds 1.005, the sinterability declines, thereby sufficient values of the density, the piezoelectric strain constant and the mechanical quality factor cannot be obtained.

Cobalt and niobium in Chemical Formula 5 are factors to inhibit deterioration in properties with time. The composition a of cobalt and niobium ($CO_{1/3}Nb_{2/3}$) is within a range from 0.005 to 0.03 inclusive, because if it is less than 0.005, the effect of inhibiting deterioration in properties with time cannot be sufficiently obtained, and if it exceeds 0.03, it adversely affects the piezoelectric strain constant, the mechanical quality factor and so on, thereby resulting in deterioration in properties.

Zinc and niobium in Chemical Formula 5 are factors to reduce the firing temperature while maintaining the properties. The composition b of zinc and niobium ($Zn_{1/3}Nb_{2/3}$) is within a range from 0.05 to 0.2 inclusive, because if it is out of the range, sufficient properties cannot be obtained when firing at a low temperature, and specifically it is difficult to inhibit a decline in the piezoelectric strain constant and deterioration in properties with time.

The composition c of titanium and the composition d of zirconium in Chemical Formula 5 are factors to increase the piezoelectric strain constant. The composition c of titanium is within a range from 0.36 to 0.49 inclusive, and the composition d of zirconium is within a range from 0.39 to 0.48 inclusive, because a larger piezoelectric strain constant can be obtained in the vicinity of such a morphotropic phase boundary.

The piezoelectric ceramic comprises 0.1 mass % to 1.0 mass % inclusive of at least one kind selected from the group consisting of antimony, niobium and tantalum as a sub-component in the form of oxide ($Sb_2O_3$, $Nb_2O_5$, $Ta_2O_5$) per 1 mol of the main component represented by Chemical Formula 5. The sub-component is provided to improve the properties while maintaining a low firing temperature. The content of the sub-component is within a range from 0.1 mass % to 1.0 mass % inclusive in the form of oxide per 1 mol of the main component, because if the content is out of the range, sufficient properties cannot be obtained when firing at a low temperature, and specifically it is difficult to inhibit a decline in the piezoelectric strain constant and deterioration in properties with time. Further, the sub-component in the form of solid solution is contained in the oxide of the main component, and is positioned at the so-called B-site where titanium and zirconium can be held.

The piezoelectric ceramic having such a configuration can be manufactured through, for example, the following steps.

At first, as the materials of the main components, for example, lead oxide powder, titanium oxide powder, zirconium oxide powder, zinc oxide powder, niobium oxide powder and cobalt oxide powder are prepared. Further, as the material of the sub-component, for example, at least one kind selected from the group consisting of antimony oxide powder, niobium oxide powder and tantalum oxide powder is prepared. Incidentally, as these materials, carbonate, oxalate or a hydroxide which becomes an oxide through firing may be used instead of the oxides.

Next, these materials of the main component and the sub-component are mixed as in the case of the first embodiment, and are pre-fired for 2 hours to 8 hours at 800° C. to 850° C. Then, for example, as in the case of the first embodiment, the pre-fired body is pulverized, granulated and pressed, and then the pressed body is fired preferably at 1050° C. or less, for example, at a low temperature ranging from 950° C. to 1050° C. for 2 hours to 6 hours. After that, for example, as in the case of the first embodiment, polarization is carried out. Thereby, the above piezoelectric ceramic can be obtained.

As in the case of the first embodiment, such a piezoelectric ceramic is preferably used for the material of a piezoelectric device such as an actuator, a piezoelectric buzzer, a sound compound and a sensor, specifically the material of the actuator.

Figure 3:
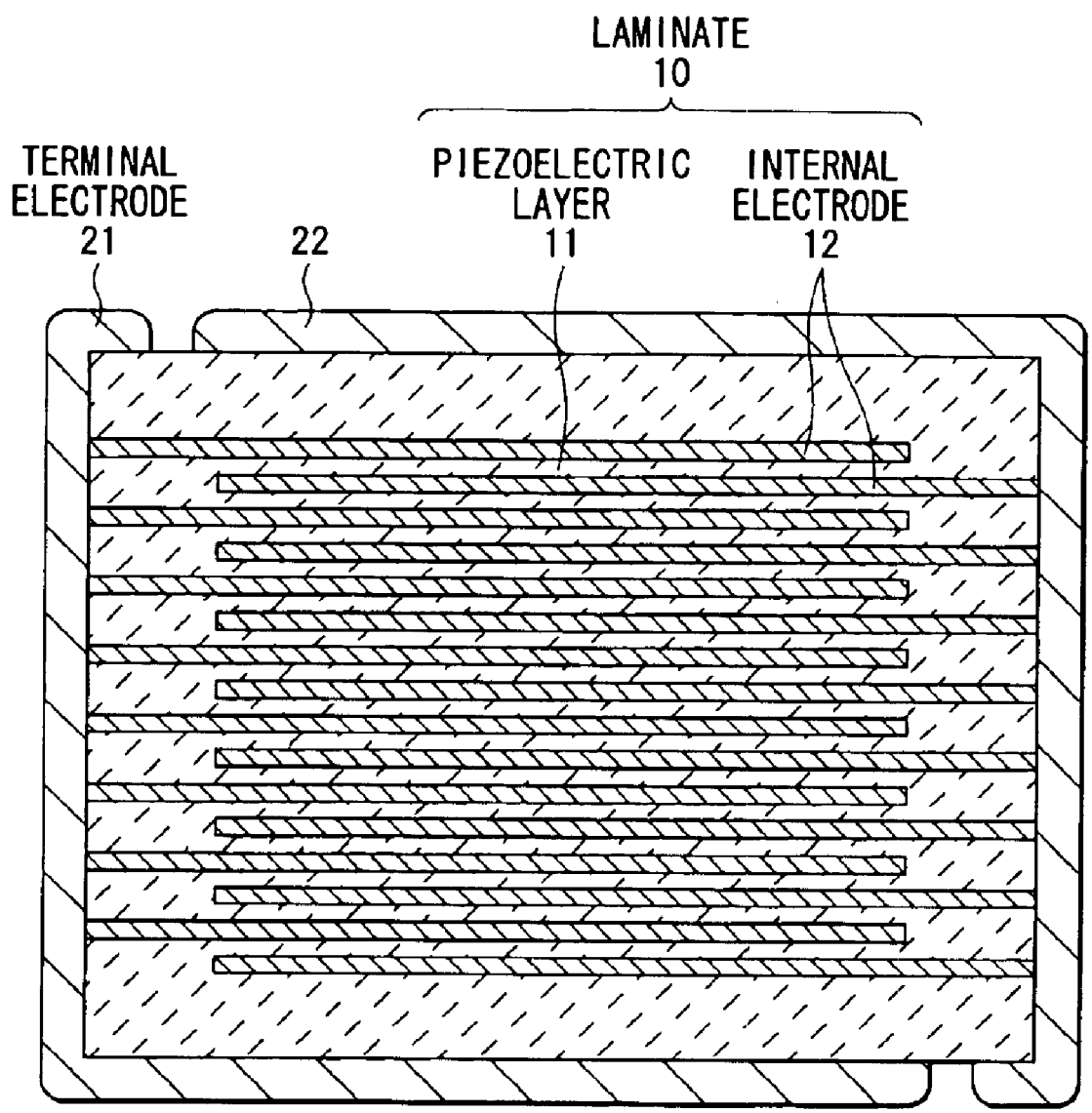
FIG. 3 is a sectional view of an example of the configuration of a piezoelectric device using a piezoelectric ceramic according to a second embodiment of the invention.

FIG. 3 is an example of the configuration of a piezoelectric device using the piezoelectric ceramic according to the embodiment. As in the case of the first embodiment, the piezoelectric device comprises a laminate including a plurality of piezoelectric layers 11 made of, for example, the piezoelectric ceramic according to the embodiment and a plurality of internal electrodes 12 which are alternately laminated, and a pair of terminal electrodes 21 and 22 electrically connected with the internal electrodes 12 are disposed in the both extending directions of the internal electrodes 12, respectively. However, the piezoelectric device is distinguished from that of the first embodiment by the fact that a rectangular extensional vibration mode is used, so parts of the terminal electrodes 21 and 22 extend to the terminal electrodes 21 and 22 facing along the end faces of the piezoelectric layers 11 in the laminating direction, and when one side of the internal electrodes 12 in the extensional direction is fixed to use, a lead wire can be connected with the internal electrodes 12 on the fixed side. Except for the above configuration, the second embodiment is identical to the first embodiment.

The piezoelectric device can be manufactured, for example, as in the case of the first embodiment.

Thus, according to the embodiment, the oxide represented by Chemical Formula 5 as the main component and a predetermined amount of at least one kind selected from the group consisting of antimony, niobium and tantalum as the sub-component are comprised, so a larger piezoelectric strain constant and a higher Curie temperature can be obtained, and deterioration in properties with time can be inhibited, and the firing temperature can be as low as at 1050° C. or less. Therefore, when, for example, the multilayer piezoelectric device shown in FIG. 3 is formed, a low-cost material such as a silver-palladium alloy containing a small amount of palladium can be used for the internal electrodes 12, thereby the piezoelectric device which is lower-cost and more reliable than the conventional one can be obtained.

[Third Embodiment]

A piezoelectric ceramic according to a third embodiment comprises an oxide represented by Chemical Formula 3 or Chemical Formula 4 as the main component.

In Chemical Formula 3, the values of A, a, b and c are within a range satisfying $a+b+c=1$, $0.99 \leq A \leq 1.005$, $0.05 \leq a \leq 0.25$, $0.35 \leq b \leq 0.50$, $0.38 \leq c \leq 0.48$, respectively. The composition of zinc and niobium in ($Zn_{1/3}Nb_{2/3}$) and the composition of oxygen are stoichiometrically determined, and they may deviate from the stoichiometric composition.

Moreover, in Chemical Formula 4, the values of A, B, a, b and c are within a range satisfying $a+b+c=1$, $0.99 \leq A \leq 1.005$, $0.005 \leq B \leq 0.1$, $0.05 \leq a \leq 0.25$, $0.35 \leq b \leq 0.50$, $0.38 \leq c \leq 0.48$, respectively. Me represents at least one kind selected from the group consisting of calcium, strontium and barium. The composition of oxygen is stoichiometrically determined, and it may deviate from the stoichiometric composition.

The oxide represented by Chemical Formula 3 or Chemical Formula 4 has a perovskite structure, and lead and at least one kind selected from the group consisting of calcium, strontium and barium are positioned at the so-called A-site, and zinc, niobium, titanium and zirconium are positioned at the so-called B-site.

Further, the oxide represented by Chemical Formula 4 contains at least one kind selected from the group consisting of calcium, strontium and barium instead of a part of lead in the oxide represented by Chemical Formula 3 so as to be capable of further improving the piezoelectric strain constant. The value of B in Chemical Formula 4, that is, the amount of at least one kind selected from the group consisting of calcium, strontium and barium is 0.005 or over, because if the value is less than 0.005, the piezoelectric strain constant cannot be sufficiently improved, and the value is 0.1 or less, because if the value exceeds 0.1, the sinterability declines, and thereby the piezoelectric strain constant and the strength decline, and the Curie temperature is reduced.

The composition A of lead in Chemical Formula 3, or the composition A of lead and at least one kind selected from the group consisting of calcium, strontium and barium in Chemical Formula 4 is a factor which has an influence in sinterability. Further, the composition A is the composition ratio of an element positioned at the so-called A-site when the composition of $[(Zn_{1/3}Nb_{2/3})_a Ti_b Zr_c]$ that is positined at the so-called B-site is 1. The value of A is 0.99 or over, because if the value is less than 0.99, firing at a relatively low temperature is difficult, and, for example, sintering at a firing temperature of 1050° C. or less is difficult. Further, the value of A is 1.005 or less, because if the value exceeds 1.005, the sinterability declines, and as a result, the piezoelectric properties and strength decline.

Zinc and niobium ($Zn_{1/3}Nb_{2/3}$) in Chemical Formula 3 or Chemical Formula 4 are factors to reduce the firing temperature while maintaining the properties. The composition a of zinc and niobium ($Zn_{1/3}Nb_{2/3}$) is within a range from 0.05 to 0.25 inclusive, because if it is less than 0.05, a sufficient effect of reducing the firing temperature cannot be obtained, and if it exceeds 0.25, it affects the sinterability, thereby the piezoelectric strain constant and the strength decline.

The composition b of titanium and the composition c of zirconium in Chemical Formula 3 or Chemical Formula 4 are factors to increase the piezoelectric strain constant. The composition b of titanium is within a range from 0.35 to 0.50 inclusive, and the composition c of zirconium is within a range from 0.38 to 0.48 inclusive, because a larger piezoelectric strain constant can be obtained in the vicinity of such a morphotropic phase boundary.

The piezoelectric ceramic comprises 0.01 mass % to 0.8 mass % inclusive of at least one kind selected from the group consisting of iron, cobalt, nickel and copper as the first sub-component in the form of oxide ($Fe_2O_3$, CoO, NiO, CuO) per 1 mol of the main component represented by Chemical Formula 3 or Chemical Formula 4. The first sub-component is provided to improve the sinterability so that the firing temperature can be further reduced. The content of the first sub-component is within a range from 0.01 mass % to 0.8 mass % inclusive in the form of oxide per 1 mol of the main component, because if the content is less than 0.01 mass %, the sinterability cannot be sufficiently improved, and if the content exceeds 0.8 mass %, contrarily, the sinterability declines.

The piezoelectric ceramic comprises 0.1 mass % to 1.0 mass % inclusive of at least one kind selected from the group consisting of antimony, niobium and tantalum as the second sub-component in the form of oxide ($Sb_2O_3$, $Nb_2O_5$, $Ta_2O_5$) per 1 mol of the main component represented by Chemical Formula 3 or Chemical Formula 4. The second sub-component is provided to improve the properties, while maintaining a low firing temperature. The content of the second sub-component is within a range from 0.1 mass % to 1.0 mass % inclusive in the form of oxide per 1 mol of the main component, because if the content is less than 0.1 mass %, a sufficient effect by adding the second sub-component cannot be obtained, and if the content exceeds 1.0 mass %, the sinterability declines, and thereby the piezoelectric properties and the strength decline. Further, the first sub-component and the second sub-component in the form of solid solution is contained in the oxide of the main component, and are positioned at the so-called B-site where titanium and zirconium can be held.

The piezoelectric ceramic having such a configuration can be manufactured for example, in the same manner as the first embodiment. Further, as in the case of the first embodiment and the second embodiment, the piezoelectric ceramic is preferably used for the material of a piezoelectric device such as an actuator, a piezoelectric buzzer, a sound compound and a sensor, specifically the material of the actuator. Examples of the piezoelectric device are the same as described in the first embodiment and the second embodiment.

Thus, according to the embodiment, the oxide represented by Chemical Formula 3 or Chemical Formula 4 as the main component, a predetermined amount of at least one kind selected from the group consisting of iron, cobalt, nickel and copper as the first sub-component and a predetermined amount of at least one kind selected from the group consisting of antimony, niobium and tantalum as the second sub-component are comprised, so a larger piezoelectric strain constant and a larger mechanical strength can be obtained, and the firing temperature can be as low as 1050° C. or less. Therefore, when, for example, the multilayer piezoelectric device is formed, a low-cost material such as a silver-palladium alloy containing a small amount of palladium can be used for the internal electrode, thereby the piezoelectric device which is lower-cost and smaller in size than the conventional one can be obtained.

More specifically, when the oxide represented by Chemical Formula 4 is the main component, the oxide contains at least one kind selected from the group consisting of calcium, strontium and barium instead of a part of lead in the oxide, therefore a larger piezoelectric strain constant can be obtained.

Moreover, specific examples of the invention are described below.

EXAMPLES 1-1 and 1-2

The piezoelectric ceramic comprising the oxide represented by Chemical Formula 1 as the main component and iron as the first sub-component was produced. At first, as the materials of the main component, lead oxide power, titanium oxide powder, zirconium oxide powder, zinc oxide powder, niobium oxide powder and magnesium oxide powder were prepared, and iron oxide powder was prepared as the material of the first sub-component. Next, after these materials were sufficiently dried and weighed so that the composition was within a range shown in Chemical Formula 1 and Table 1, the materials were wet-mixed by a ball mill, dried, and pre-fired for 2 hours to 6 hours at 750° C. to 850° C. Incidentally, in Table 1, the kinds of the first sub-component are shown in the form of oxide, and the content of the first sub-component are shown as a value in the form of oxide per 1 mol of the main component. The kinds and the contents of sub-components in other tables below are shown likewise.

Then, the pre-fired body was wet-pulverized by the ball mill and dried to prepare pre-fired powder. After that, a polyvinyl alcohol-based binder was added to the pre-fired powder to granulate the powder, and then the granulated body was pressed into a column shape with a height of approximately 11 mm and a diameter of approximately 7 mm by the application of pressure of approximately 196 MPa. After pressing, the pressed body was fired under air atmosphere at a firing temperature of 900° C. to 1050° C. according to Table 1 for 2 hours to 4 hours. After firing, the obtained sintered body was processed to form into a column shape with a height of 7.5 mm and a diameter of 3 mm, and electrodes made of silver were formed on both end faces of the column-shaped sintered body. After that, an electric field of 2 kV/mm to 2.5 kV/mm was applied to the sintered body in silicon oil for 30 minutes to carry out polarization. Thereby, the piezoelectric ceramics of Examples 1-1 and 1-2 were obtained.

The densities ps of the piezoelectric ceramics of Examples 1-1 and 1-2 were determined by the Archimedean method. Further, the device capacitances c, resonance frequencies fr and antiresonance frequencies fa thereof were measured by an impedance analyzer, and based on the measured results, the piezoelectric strain constants $d_{33}$ thereof were determined. The results are shown in Table 2.

As Comparative Examples 1-1 and 1-2 with respect to the Examples, piezoelectric ceramics were produced in the same manner as the Examples except that the composition and the firing temperature thereof were changed as shown in Table 1. Further, in Comparative Example 1-1, the value of A in Chemical Formula 1 was less than 0.99, and in Comparative Example 1-2, the value of A was larger than 1.01. Like the Examples, the densities ρs and the piezoelectric strain constants $d_{33}$ of the piezoelectric ceramics of Comparative Examples 1-1 and 1-2 were measured. The measured results are also shown in Table 2.

As shown in Table 2, Examples 1-1 and 1-2 obtained a density ρs of 7.8 Mg/m³ or over and a piezoelectric strain constant $d_{33}$ of 550 pC/N or over. On the other hand, in Comparative Example 1-1 in which the value of A was less than 0.99, the sinterability was insufficient, therefore the density ρs and the piezoelectric strain constant $d_{33}$ could not be measured, and in Comparative Example 1-2 in which the value of A was larger than 1.01, the values of the density ρs and the piezoelectric strain constant $d_{33}$ were both insufficient.

In other words, it turned out that when the value of A was within a range of 0.99≦A≦1.01, the sinterability could be improved, so even if firing is carried out at a low temperature of 1050° C. or less, superior piezoelectric properties such as a piezoelectric strain constant $d_{33}$ of 550 pC/N or over could be obtained.

EXAMPLES 1-3 and 1-4

Piezoelectric ceramics were produced in the same manner as Examples 1-1 and 1-2 except that the composition and the firing temperature were changed as shown in Table 3. At that time, as the first sub-component, nickel was added instead of iron, and nickel oxide powder was used as the material. Further, as Comparative Examples 1-3 and 1-4 with respect to the Examples, piezoelectric ceramics were produced in the same manner as the Examples except that the composition and the firing temperature were changed as shown in Table 3. In Comparative Example 1-3, the value of b in Chemical Formula 1, that is, the composition of zinc and niobium ($Zn_{1/3}Nb_{2/3}$) was zero, and in Comparative Example 1-4, the value of b was larger than 0.25.

Like Examples 1-1 and 1-2, the densities ρs and the piezoelectric strain constants $d_{33}$ of the piezoelectric ceramics of Examples 1-3 and 1-4 and Comparative Examples 1-3 and 1-4 were measured. The measured results are shown in Table 4.

As shown in Table 4, Examples 1-3 and 1-4 obtained a density ρs of 7.8 Mg/m³ or over and a piezoelectric strain constant $d_{33}$ of 550 pC/N or over. On the other hand, in Comparative Example 1-3 in which the value of b was zero, the sinterability was insufficient, therefore the density ρs and the piezoelectric strain constant d33 could not be measured, and in Comparative Example 1-4 in which the value of b was larger than 0.25, the values of the density ρs and the piezoelectric strain constant $d_{33}$ were both insufficient.

In other words, it turned out that in the case where the value of b in Chemical Formula 1 was within a range of 0.05≦b≦0.25, even if the firing temperature was as low as 1050° C. or less, superior piezoelectric properties such as a piezoelectric strain constant $d_{33}$ of 550 pC/N or over could be obtained.

EXAMPLES 1-5 through 1-10

Piezoelectric ceramics were produced in the same manner as Examples 1-1 and 1-2 except that the composition and the firing temperature were changed as shown in Table 5. At that time, as the first sub-component, one or more kinds selected from the group consisting of iron, cobalt, nickel and copper were added, and powder made of one or more kinds selected from the group consisting of iron oxide, cobalt oxide, nickel oxide and copper oxide was used as the materials. Further, as Comparative Examples 1-5 and 1-6, with respect to the Examples, piezoelectric ceramics were produced in the same manner as the Examples except that the composition and the firing temperature were changed as shown in Table 5. In Comparative Example 1-5, the first sub-component was not comprised, and in Comparative Example 1-6, the content of nickel as the first sub-component was larger than 0.8 mass % in the form of oxide per 1 mol of the main component.

Like Examples 1-1 and 1-2, the densities ρs and the piezoelectric strain constants $d_{33}$ of the piezoelectric ceramics of Examples 1-5 through 1-10 and Comparative Examples 1-5 and 1-6 were measured. The measured results are shown in Table 6.

As shown in Table 6, Examples 1-5 through 1-10 obtained a density ρs of 7.8 Mg/m³ or over and a piezoelectric strain constant $d_{33}$ of 550 pC/N or over. On the other hand, in Comparative Example 1-5 in which the first sub-component was not comprised, and Comparative Example 1-6 in which the content of the first sub-component was larger than 0.8 mass %, the values of the density ρs and the piezoelectric strain constant $d_{33}$ were both insufficient.

In other words, it turned out that in the case where 0.01 mass % to 0.8 mass % inclusive of at least one kind selected from the group consisting of iron, cobalt, nickel and copper in the form of oxide per 1 mol of the main component was comprised as the first sub-component, even if the firing temperature was as low as 1050° C. or less, superior piezoelectric properties such as a piezoelectric strain constant $d3_3$ of 550 pC/N or over could be obtained.

EXAMPLES 1-11 through 1-20

Piezoelectric ceramics were produced in the same manner as Examples 1-1 and 1-2 except that the second sub-component was added and the composition and the firing temperature were changed as shown in Table 7. At that time, at least one kind selected from iron, cobalt, nickel and copper was added as the first sub-component, and powder made of at least one kind selected from iron oxide, cobalt oxide, nickel oxide and copper oxide were used as the material, and at least one kind selected from the group consisting of antimony, niobium and tantalum was added as the second sub-component, and powder made of at least one kind selected from the group consisting of antimony oxide, niobium oxide and tantalum oxide was used as the material.

As Comparative Example 1-7 with respect to the Examples, a piezoelectric ceramic was produced in the same manner as the Examples except that the composition and the firing temperature were changed as shown in Table 7. In Comparative Example 1-7, the content of antimony as the second sub-component was larger than 1.0 mass % in the form of oxide per 1 mol of the main component.

Like Examples 1-1 and 1-2, the densities ρs and the piezoelectric strain constants $d_{33}$ of the piezoelectric ceramics of Examples 1-11 through 1-20 and Comparative Example 1-7 were measured. The measured results are shown in Table 8.

As shown in Table 8, Examples 1-11 through 1-20 obtained a density ρs of 7.8 Mg/m³ or over and a piezoelectric strain constant $d_{33}$ of 580 pC/N or over. On the other hand, in Comparative Example 1-7 in which the content of the second sub-component was larger than 1.0 mass %, the values of the density ρs and the piezoelectric strain constant $d_{33}$ were both insufficient. Further, as can be seen from the comparison between Tables 2, 4 and 6 and Table 8, Examples 1-11 through 1-20 in which the second sub-component was added could obtain a larger piezoelectric strain constant $d_{33}$, compared with Examples 1-1 through 1-10 in which the second sub-component was not added. For example, depending upon conditions, a piezoelectric strain constant $d_{33}$ of 600 pC/N or over could be obtained.

In other words, it turned out that when 0.05 mass % to 1.0 mass % inclusive of at least one kind selected from the group consisting of antimony, niobium and tantalum in the form of oxide per 1 mol of the main component was comprised as the second sub-component, the piezoelectric strain constant $d_{33}$ could be further improved, and even if the firing temperature was as low as 1050° C. or less, superior piezoelectric properties could be obtained.

EXAMPLES 1-21 through 1-27

Piezoelectric ceramics were produced in the same manner as Examples 1-6, 1-12, 1-13 and 1-15 except that the third sub-component was added, the composition was changed as shown in Table 9, and the firing temperature was reduced as shown in Table 10. At that time, at least one kind selected from the group consisting of sodium and potassium was added as the third sub-component, and powder made of at least one kind selected from the group consisting of sodium carbonate and potassium carbonate was used as the material. With regard to the compositions except for the composition of the third sub-component, Example 1-21, Example 1-22 through 1-25, Example 1-26 and Example 1-27 were identical to Example 1-6, Example 1-12, Example 1-13 and Example 1-15, respectively.

As Comparative Example 1-8 with respect to the Examples, a piezoelectric ceramic was produced in the same manner as the Examples except that the composition was changed as shown in Table 9 and the firing temperature was changed as shown in Table 10. In Comparative Example 1-8, the content of potassium as the third sub-component was larger than 0.1 mass % in the form of oxide per 1 mol of the main component. Moreover, as Reference Examples 1-1 through 1-4, piezoelectric ceramics were produced in the same manner as Examples 1-6, 1-12, 1-13 and 1-15 except that the firing temperature was reduced as shown in Table 10. Reference Examples 1-1, 1-2, 1-3 and 1-4 corresponded to Examples 1-6, 1-12, 1-13 and 1-15, respectively.

Like Examples 1-6, 1-12, 1-13 and 1-15, the densities ρs and the piezoelectric strain constants $d_{33}$ of the piezoelectric ceramics of Examples 1-21 through 1-27, Comparative Example 1-8 and Reference Examples 1-1 through 1-4 were measured. The measured results are shown in Table 10.

As shown in Table 10, Examples 1-21 through 1-27 obtained a density ρs of 7.8 Mg/m³ or over and a piezoelectric strain constant d33 of 560 pC/N or over. On the other hand, Comparative Example 1-8 in which the content of the third sub-component was larger than 0.1 mass % was abnormally sintered, and the density and the insulation resistance declined so that polarization could not be carried out, and as a result, the piezoelectric strain constant $d_{33}$ could not be measured. Further, in Reference Examples 1-1 through 1-4 in which the third sub-component was not comprised, due to a low firing temperature, they are not sufficiently sintered, so the piezoelectric strain constant $d_{33}$ could not be measured.

In other words, it turned out that in the case where 0.01 mass % to 0.1 mass % inclusive of at least one kind selected from the group consisting of sodium and potassium in the form of oxide per 1 mol of the main component was comprised as the third sub-component, even if the firing temperature was further reduced to 1000° C. or less, superior piezoelectric properties could be obtained.

EXAMPLES 2-1 and 2-2

Piezoelectric ceramics were produced in the same manner as Examples 1-1 and 1-2 except that the oxide represented by Chemical Formula 2 was the main component and the composition and the firing temperature were changed as shown in Chemical Formula 2 and Table 11. At that time, Me in Chemical Formula 2 was strontium, and strontium carbonate powder was used as the material.

As Comparative Examples 2-1 and 2-2 with respect to the Examples, piezoelectric ceramics were produced in the same manner as the Examples except that the composition and the firing temperature were changed as shown in Table 11. In Comparative Example 2-1, the value of A in Chemical Formula 2 was less than 0.99, and in Comparative Example 2-2, the value of A was larger than 1.01.

Like Examples 1-1 and 1-2, the densities ρs and the piezoelectric strain constants $d_{33}$ of the piezoelectric ceramics of Examples 2-1 and 2-2 and Comparative Examples 2-1 and 2-2 were measured. The measured results are shown in Table 12.

As shown in Table 12, Examples 2-1 and 2-2 obtained a density ρs of 7.8 Mg/m³ or over and a piezoelectric strain constant $d_{33}$ of 600 pC/N or over. On the other hand, in Comparative Example 2-1 in which the value of A was less than 0.99, the sinterability was insufficient, so the density ρs and the piezoelectric strain constant $d_{33}$ could not be measured, and in Comparative Example 2-2 in which the value of A was larger than 1.01, the values of the density ρs and the piezoelectric strain constant $d_{33}$ were insufficient. Further, as can be seen from the comparison between Examples 2-1 and 2-2 and Examples 1-1 and 1-2 (refer to Tables 1 and 2), Examples 2-1 and 2-2 in which a part of lead was replaced with strontium could obtain a larger piezoelectric strain constant $d_{33}$.

In other words, it turned out that when a part of lead was replaced with strontium, the piezoelectric strain constant $d_{33}$ could be further improved, and when the value of A in Chemical Formula 2 was within a range of $0.99 \leq A \leq 1.01$, the sinterability could be improved, so even if firing was carried out at a low temperature of 1050° C. or less, superior piezoelectric properties such as a piezoelectric strain constant $d_{33}$ of 600 pC/N or over could be obtained.

EXAMPLES 2-3 through 2-5

Piezoelectric ceramics were produced in the same manner as Examples 2-1 and 2-2 except that the composition and the firing temperature were changed as shown in Table 13. In other words, the oxide represented by Chemical Formula 2 was the main component, and the first sub-component was added to change the composition and the firing temperature. At that time, Me in Chemical Formula 2 was any one selected from the group consisting of strontium, calcium and barium, and any one selected from the group consisting of strontium carbonate powder, calcium carbonate powder and barium carbonate powder was used as the material. Further, as the first sub-component, copper or nickel was added instead of iron, and copper oxide powder or nickel oxide powder was used as the material.

As Comparative Example 2-3 with respect to the Examples, a piezoelectric ceramic was produced in the same manner as the Examples except that the composition and the firing temperature were changed as shown in Table 13. In Comparative Example 2-3, Me in Chemical Formula 2 was barium, and the composition B was larger than 0.1.

Like Examples 1-2 and 1-2, the densities ρs and the piezoelectric strain constants $d_{33}$ of the piezoelectric ceramics of Examples 2-3 through 2-5 and Comparative Example 2-3 were measured. The measured results are shown in Table 14.

As shown in Table 14, Examples 2-3 through 2-5 obtained a density ρs of 7.8 Mg/m$^3$ or over and a piezoelectric strain constant $d_{33}$ of 570 pC/N or over. On the other hand, in Comparative Example 2-3 in which the value of B was larger than 0.1, the values of the density ρs and the piezoelectric strain constant $d_{33}$ were insufficient. Further, as can be seen from the results of Examples 2-3 through 2-5, the larger the value of B became, the larger the piezoelectric strain constant $d_{33}$ became, and when the value of B exceeded 0.1 after it reached the maximum value, the piezoelectric strain constant $d_{33}$ tended to decline.

In other words, it turned out that when a part of lead was replaced with at least one kind selected from the group consisting of strontium, calcium and barium and the replaced amount, that is, the value of B in Chemical Formula 2 was within a range of $0.005 \leq B \leq 0.1$, the piezoelectric strain constant $d_{33}$ could be further improved.

EXAMPLES 2-6 and 2-7

Piezoelectric ceramics were produced in the same manner as Examples 2-1 and 2-2 except that the second sub-component was added, and the composition and the firing temperature were changed as shown in Table 15. In other words, the oxide represented by Chemical Formula 2 was the main component, and the first sub-component and the second sub-component were added to change the composition and the firing temperature. At that time, nickel was added as the first sub-component, and nickel oxide powder was used as the material. Further, niobium was added as the second sub-component, and niobium oxide powder was used as the material.

As Comparative Examples 2-4 and 2-5 with respect to the Examples, piezoelectric ceramics were produced in the same manner as the Examples except that the composition and the firing temperature were changed as shown in Table 15. In Comparative Example 2-4, the value of b in Chemical Formula 2, that is, the composition of zinc and niobium ($Zn_{1/3}Nb_{2/3}$) was zero, and in Comparative Example 2-5, the value of b was larger than 0.25.

Like Examples 1-1 and 1-2, the densities ρs and the piezoelectric strain constants $d_{33}$ of the piezoelectric ceramics of Examples 2-6 and 2-7 and Comparative Examples 2-4 and 2-5 were measured. The measured results are shown in Table 16.

As shown in Table 16, Examples 2-6 and 2-7 obtained a density ρs of 7.8 Mg/m$^3$ or over and a piezoelectric strain constant $d_{33}$ of 600 pC/N or over. On the other hand, in Comparative Example 2-4 in which the value of b was zero, the sinterability was insufficient, so the density ρs and the piezoelectric strain constant $d_{33}$ could not be measured, and in Comparative Example 2-5 in which the value of b was larger than 0.25, the values of the density ρs and the piezoelectric strain constant $d_{33}$ were insufficient.

In other words, it turned out that in the case where the oxide represented by Chemical Formula 2 was comprised as the main component, like the oxide represented by Chemical Formula 1, when the value of b in Chemical Formula 2 was within a range of $0.05 \leq b \leq 0.25$, even if the firing temperature was as low as 1050° C. or less, superior piezoelectric properties such as a piezoelectric strain constant $d_{33}$ of 600 pC/N or over could be obtained.

EXAMPLES 2-8 through 2-13

Piezoelectric ceramics were produced in the same manner as Examples 2-1 and 2-2 except that the composition and the firing temperature were changed as shown in Table 17. In other words, the oxide represented by Chemical Formula 2 was the main component, and the first sub-component was added to change the composition and the firing temperature. At that time, one or more kinds selected from the group consisting of iron, cobalt, nickel and copper were added as the first sub-component, and powder made of one or more kinds selected from the group consisting of iron oxide, cobalt oxide, nickel oxide and copper oxide was used as the material.

As Comparative Examples 2-6 and 2-7 with respect to the Examples, piezoelectric ceramics were produced in the same manner as the Examples except that the composition and the firing temperature were changed as shown in Table 17. In Comparative Example 2-6, the first sub-component was not comprised, and in Comparative Example 2-7, the content of nickel as the first sub-component was larger than 0.8 mass % in the form of oxide per 1 mol of the main component.

Like Examples 1-1 and 1-2, the densities ρs and the piezoelectric strain constants $d_{33}$ of the piezoelectric ceramics of Examples 2-8 through 2-13 and Comparative Examples 2-6 and 2-7 were measured. The measured results are shown in Table 18.

As shown in Table 18, Examples 2-8 through 2-13 obtained a density ρs of 7.8 Mg/m$^3$ or over and a piezoelectric strain constant $d_{33}$ of 600 pC/N or over. On the other hand, in Comparative Example 2-6 in which the first sub-component was not comprised, the sinterability was insufficient, so the density ρs and the piezoelectric strain constant $d_{33}$ could not be measured, and in Comparative Example 2-7 in which the content of the first sub-component was larger than 0.8 mass %, the values of the density ρs and the piezoelectric strain constant $d_{33}$ were insufficient.

In other words, it turned out that in the case where the oxide represented by Chemical Formula 2 was the main component, when 0.01 mass % to 0.8 mass % inclusive of at least one kind selected from the group consisting of iron, cobalt, nickel and copper in the form of oxide per 1 mol of the main component was comprised as the first sub-component, even if the firing temperature was as low as 1050° C. or less, superior piezoelectric properties such as a piezoelectric strain constant $d_{33}$ of 600 pC/N or over could be obtained.

EXAMPLES 2-14 through 2-20

Piezoelectric ceramics were produced in the same manner as Examples 2-1 and 2-2 except that the second sub-component was added, and the composition and the firing temperature were changed as shown in Table 19. In other words, the oxide represented by Chemical Formula 2 was the main component, and the first sub-component and the second sub-component were added to change the composition and the firing temperature. At that time, at least one kind selected from the group consisting of iron, cobalt, nickel and copper was added as the first sub-component, and powder made of at least one kind selected from the group consisting of iron oxide, cobalt oxide, nickel oxide and copper oxide was used as the material. Further, at least one kind selected from the group consisting of antimony, niobium and tantalum was added as the second sub-component, and powder made of at least one kind selected from the group consisting of antimony oxide, niobium oxide and tantalum oxide was used as the material.

As Comparative Example 2-8 with respect to the Examples, a piezoelectric ceramic was produced in the same manner as the Examples except that the composition and the firing temperature were changed as shown in Table 19. In Comparative Example 2-8, the content of antimony as the second sub-component was larger than 1.0 mass % in the form of oxide per 1 mol of the main component.

Like Examples 1-1 and 1-2, the densities ρs and the piezoelectric strain constants d33 of the piezoelectric ceramics of Examples 2-14 through 2-20 and Comparative Example 2-8 were measured. The measured results are shown in Table 20.

As shown in Table 20, Examples 2-14 through 2-20 obtained a density ρs of 7.8 Mg/m³ or over and a piezoelectric strain constant $d_{33}$ of 610 pC/N or over. On the other hand, in Comparative Example 2-8 in which the content of the second sub-component was larger than 1.0 mass %, the values of the density ρs and the piezoelectric strain constant $d_{33}$ were insufficient. As can be seen from the comparison between Tables 12, 14 and 18 and Table 20, Examples 2-14 through 2-20 in which the second sub-component was comprised could obtain a larger piezoelectric strain constant $d_{33}$, compared with Examples 2-1 through 1-5 and Examples 2-8 through 2-13 in which the second sub-component was not comprised. For example, depending upon conditions, the piezoelectric strain constant $d_{33}$ of 650 pC/N or over could be obtained.

In other words, it turned out that in the case where the oxide represented by Chemical Formula 2 was the main component, when 0.05 mass % to 1.0 mass % inclusive of at least one kind selected from the group consisting of antimony, niobium and tantalum in the form of oxide per 1 mol of the main component was comprised as the second sub-component, the piezoelectric strain constant $d_{33}$ could be further improved, and even if the firing temperature was as low as 1050° C. or less, superior piezoelectric properties could be obtained.

EXAMPLES 2-21 through 2-27

Piezoelectric ceramics were produced in the same manner as Examples 2-13 and 2-19 except that the third sub-component was added and the composition was changed as shown in Table 21 and the firing temperature was reduced as shown in Table 22. At that time, at least one kind selected from the group consisting of sodium and potassium was added as the third sub-component, and powder made of at least one kind selected from the group consisting of sodium carbonate and potassium carbonate was used as the material. With regard to the compositions except for the composition of the third sub-component, Example 2-21 and Example 2-22 were identical to Example 2-13 and Example 2-19, respectively.

As Reference Examples 2-1 and 2-2 with respect to the Examples, piezoelectric ceramics were produced in the same manner as Examples 2-13 and 2-19 except that the firing temperature was reduced as shown in Table 22. Reference Examples 2-1 and 2-2 corresponded to Examples 2-13 and 2-19, respectively.

Like Examples 2-13 and 2-19, the densities ρs and the piezoelectric strain constants d33 of the piezoelectric ceramics of Examples 2-21 and 2-22 and Reference Examples 2-1 and 2-2 were measured. The measured results are shown in Table 22.

As shown in Table 22, Examples 2-21 and 2-22 obtained a density ρs of 7.8 Mg/m³ or over and a piezoelectric strain constant $d_{33}$ of 600 pC/N or over. On the other hand, in Reference Examples 2-1 and 2-2 in which the third sub-component was not comprised, due to a lower firing temperature, they are not sufficiently sintered, so the piezoelectric strain constant $d_{33}$ could not be measured.

In other words, it turned out that in the case where the oxide represented by Chemical Formula 2 was the main component, when 0.01 mass % to 0.1 mass % inclusive of at least one kind selected from the group consisting of sodium and potassium in the form of oxide per 1 mol of the main component was comprised as the third sub-component, even if the firing temperature was further reduced to 1000° C. or less, superior piezoelectric properties could be obtained.

EXAMPLES 3-1 and 3-2

Piezoelectric ceramics comprising the oxide represented by Chemical Formula 5 as the main component and niobium as the sub-component were produced. At first, as the materials of the main component and the sub-component, lead oxide powder, titanium oxide powder, zirconium oxide powder, zinc oxide powder, niobium oxide powder and cobalt oxide powder were prepared. Next, after these materials were sufficiently dried, the materials were weighed so that the composition was within the range shown in Chemical Formula 5 and Table 23. Then, the materials were wet-mixed by a ball mill, dried, and pre-fired for 2 hours to 4 hours at 800° C. to 850° C. Then, the pre-fired body was wet-pulverized by the ball mill and dried to prepare pre-fired powder. After that, a polyvinyl alcohol-based binder was added to the pre-fired powder to granulate the powder, and then the granulated body was pressed into the shape of a square approximately 20 mm on a side with a thickness of 1.5 mm by the application of pressure of approximately 196 MPa.

After pressing, the pressed body was fired under air atmosphere at a firing temperature of 950° C. to 1050° C. according to Table 23 for 2 hours to 4 hours. After firing, the obtained sintered body was processed to have a thickness of 1 mm, and electrodes made of silver were formed. After that, the sintered body on which the electrodes were formed was processed to form a 12 mm×3 mm rectangular shape, and then a voltage of 3 kV/mm was applied to the sintered body in 120° C. silicon oil for 30 minutes to carry out polarization. Thereby, the piezoelectric ceramics of Examples 3-1 and 3-2 were obtained.

The densities ρs of the piezoelectric ceramics of Examples 3- 1 and 3-2 were determined through the Archimedean method. Further, the device capacitances c, resonance frequencies fr and antiresonance frequencies fa thereof were measured by an impedance analyzer, and based on the measured results, the piezoelectric strain constants $d_{31}$ and the mechanical quality factors $Q_m$ thereof were determined. The results are shown in Table 24. Moreover, when the Curie temperatures Tc of Examples 3-1 and 3-2 were measured by a thermal analyzer, an excellent value of 300° C. or over was obtained.

Further, multilayer piezoelectric devices as shown in FIG. 3 were produced by the use of the piezoelectric ceramics of Examples 3-1 and 3-2. Each of the piezoelectric layers 11 in between the internal electrodes. 12 had a thickness of 20 μm, the laminated number thereof was 7 layers, and the size thereof was 10 mm long by 2.5 mm wide. A silver-palladium alloy was used for the internal electrodes 12.

The rates of change of displacement of the obtained piezoelectric devices of Examples 3-1 and 3-2 were determined as deterioration with time. The amount of displacement was measured by a laser Doppler vibrometer. The rate of change of displacement was measured as follow. The amount of displacement measured after the device was produced was used as the initial value, and after the device was left at room temperature for 1000 hours, the amount of displacement was measured again, and then the rate of change of displacement was determined by the proportion of the initial value to the amount of displacement after leaving the device. As the evaluation of properties, when the rate of change of displacement was less than ±5%, deterioration with time was small enough to evaluate that the properties were excellent, and if the rate was larger than ±5%, deterioration was too large, so the properties were evaluated to be poor. The results are also shown in Table 24. In addition, in Table 24, examples in which deterioration with time was small enough and the properties were excellent were indicated with a symbol "○", and examples in which deterioration with time was too large and the properties were poor were indicated with a symbol "X".

Moreover, as Comparative Examples 3-1 and 3-2 with respect to the Examples, piezoelectric ceramics and piezoelectric devices were produced in the same manner as the Examples, except that the composition and the firing temperature were changed as shown in Table 23. In Comparative Example 3-1, the value of A/B in Chemical Formula 5 was less than 0.99, and in Comparative Example 3-2, the value of A/B was larger than 1.005. Like the Examples, the densities ρs, the piezoelectric strain constants $d_{31}$ and the mechanical quality factors $Q_m$ of Comparative Examples 3-1 and 3-2 were measured, and the rates of change of displacement thereof were determined. The results are also shown in Table 24.

As shown in Table 24, Examples 3-1 and 3-2 obtained a density ρs of 7.8 Mg/m$^3$ or over, a piezoelectric strain constant $d_{31}$ of 200 pC/N or over, a mechanical quality factor $Q_m$ of 100 or less, and small deterioration with time. On the other hand, in Comparative Example 3-1 in which the value of A/B was less than 0.99 and Comparative Example 3-2 in which the value of A/B was larger than 1.005, the values of the density ρs, the piezoelectric strain constant $d_{31}$ and the mechanical quality factor $Q_m$ were insufficient, and the deterioration with time was large.

In other words, it turned out that when the value of A/B in Chemical Formula 5 was within a range of $0.99 \leq A/B \leq 1.005$, the sinterability could be improved, and even if firing was carried out at a low temperature of 1050° C. or less, favorable values of the density ρs, the piezoelectric strain constant $d_{31}$, the mechanical quality factor $Q_m$ and the Curie temperature Tc could be obtained, and the deterioration with time could be reduced.

EXAMPLES 3-3 and 3-4

Piezoelectric ceramics and piezoelectric devices were produced in the same manner as Examples 3-1 and 3-2 except that the composition and the firing temperature were changed as shown in Table 25. Moreover, as Comparative Examples 3-3 and 3-4 with respect to the Examples, piezoelectric ceramics and piezoelectric devices were produced in the same manner as the Examples except that the composition and the firing temperature were changed as shown in Table 25. In Comparative Example 3-3, the value of a in Chemical Formula 10 5, that is, the composition of cobalt and niobium ($Co_{1/3}Nb_{2/3}$) was less than 0.005, and in Comparative example 3-4, the value of a was larger than 0.03.

Like Examples 3-1 and 3-2, the densities ρs, the piezoelectric strain constants $d_{31}$ and the mechanical quality factor $Q_m$ of Examples 3-3 and 3-4 and Comparative Examples 3-3 and 3-4 were measured, and the rates of change of displacement thereof were determined. The results are shown in Table 26. Further, when the Curie temperatures Tc of Examples 3-3 and 3-4 were measured in the same manner as Examples 3-1 and 3-2, both of the Examples obtained favorable values, that is, a Curie temperature of 300° C. or over.

As shown in Table 26, Examples 3-3 and 3-4 obtained a density ρs of 7.8 Mg/m$^3$ or over, a piezoelectric strain constant $d_{31}$ of 200 pC/N or over, a mechanical quality factor $Q_m$ of 100 or less, and small deterioration with time. On the other hand, in Comparative Example 3-3 in which the value of a was less than. 0.005, deterioration with time was large, and in Comparative Example 3-4 in which the value of a was larger than 0.03, the values of the density ρs, the piezoelectric strain constant $d_{31}$ and the mechanical quality factor $Q_m$ were insufficient. In other words, it turned out that in the case where the value of a in Chemical Formula 5 was within a range of $0.005 \leq a \leq 0.03$, while maintaining the properties such as the density ρs, the piezoelectric strain constant $d_{31}$, the mechanical quality factor $Q_m$ and the Curie temperature Tc, deterioration with time could be inhibited.

EXAMPLES 3-5 and 3-6

Piezoelectric ceramics and piezoelectric devices were produced in the same manner as Examples 3-1 and 3-2 except that the composition and the firing temperature were changed as shown in Table 27. Moreover, as Comparative Examples 3-5 and 3-6 with respect to the Examples, piezoelectric ceramics and piezoelectric devices were produced in the same manner as the Examples except that the composition and the firing temperature were changed as shown in Table 27. In Comparative Example 3-5, the value of b in Chemical Formula 5, that is, the composition of zinc and niobium ($Zn_{1/3}Nb_{2/3}$) was less than 0.05, and in Comparative Example 3-6, the value of b was larger than 0.2.

Like Examples 3-1 and 3-2, the densities ρs, the piezoelectric strain constants $d_{31}$ and the mechanical quality factor $Q_m$ of Examples 3-5 and 3-6 and Comparative Examples 3-5 and 3-6 were measured, and the rates of change of displacement thereof were determined. The results are shown in Table 28. Further, when the Curie temperatures Tc of Examples 3-5 and 3-6 were measured in the same manner as Examples 3-1 and 3-2, both of the Examples obtained favorable values, that is, a Curie temperature of 300° C. or over.

As shown in Table 28, Examples 3-5 and 3-6 obtained a density ρs of 7.8 Mg/m$^3$ or over, a piezoelectric strain constant $d_{31}$ of 200 pC/N or over, a mechanical quality factor $Q_m$ of 100 or less, and small deterioration with time. On the other hand, in Comparative Example 3-5 in which the value of b was less than 0.05 and Comparative Example 3-6 in which the value of b was larger than 0.2, the values of the density ρs and the piezoelectric strain constant $d_{31}$ were insufficient, and the deterioration with time was large.

In other words, it turned out that in the case where the value of b in Chemical Formula 10 was within a range of $0.05 \leq b \leq 0.2$, even if the firing temperature was as low as 1050° C. or less, favorable values of the density ρs, the piezoelectric strain constant $d_{31}$, the mechanical quality factor $Q_m$ and the Curie temperature Tc could be obtained, and deterioration with time was small.

EXAMPLES 3-7 and 3-8

Piezoelectric ceramics and piezoelectric devices were produced in the same manner as Examples 3-1 and 3-2 except that the composition and the firing temperature were changed as shown in Table 29. In Examples 3-7 and 3-8, antimony was added instead of niobium as the sub-component, and antimony oxide powder was used as the material. Moreover, as Comparative Examples 3-7 and 3-8 with respect to the Examples, piezoelectric ceramics and piezoelectric devices were produced in the same manner as the Examples except that the composition and the firing temperature were changed as shown in Table 29. In Comparative Example 3-7, the value of c in Chemical Formula 5, that is, the composition of titanium was less than 0.36, and in Comparative Example 3-8, the value of c was larger than 0.49.

Like Examples 3-1 and 3-2, the densities ρs, the piezoelectric strain constants $d_{31}$ and the mechanical quality factor $Q_m$ of Examples 3-7 and 3-8 and Comparative Examples 3-7 and 3-8 were measured, and the rates of change of displacement thereof were determined. The results are shown in Table 30. Further, when the Curie temperatures Tc of Examples 3-7 and 3-8 were measured in the same manner as Examples 3-1 and 3-2, both of the examples obtained favorable values, that is, a Curie temperature of 300° C. or over.

As shown in Table 30, Examples 3-7 and 3-8 obtained a density ρs of 7.8 Mg/m$^3$ or over, a piezoelectric strain constant $d_{31}$ of 200 pC/N or over, a mechanical quality factor $Q_m$ of 100 or less, and small deterioration with time. On the other hand, in Comparative Example 3-7 in which the valve of c was less than 0.36 and Comparative Example 3-8 in which the value of c was larger than 0.49, the piezoelectric strain constant $d_{31}$ and the mechanical quality factor $Q_m$ were insufficient, and deterioration with time was large. In other words, it turned out that when titanium was comprised so that the value of c in Chemical Formula 5 was within a range of $0.36 \leq c \leq 0.49$, favorable values of the density ρs, the piezoelectric strain constant $d_{31}$, the mechanical quality factor $Q_m$ and the Curie temperature Tc could be obtained, and deterioration with time was small.

EXAMPLES 3-9 and 3-10

Piezoelectric ceramics and piezoelectric devices were produced in the same manner as Example 3-1 and 3-2 except that the composition and the firing temperature were changed as shown in Table 31. In Examples 3-9 and 3-10, antimony or tantalum was added instead of niobium as the sub-component, and antimony oxide powder or tantalum oxide powder was used as the material. Moreover; as Comparative Examples 3-9 and 3-10 with respect to the Examples, piezoelectric ceramics and piezoelectric devices were produced in the same manner as the Examples except that the composition and the firing temperature were changed as shown in Table 31. In Comparative Example 3-9, the value of d in Chemical Formula 5, that is, the composition of zirconium was less than 0.39, and in Comparative Example 3-10, the value of d was larger than 0.48.

Like Examples 3-1 and 3-2, the densities ρs, the piezoelectric strain constants $d_{31}$ and the mechanical quality factor $Q_m$ of Examples 3-9 and 3-10 and Comparative Examples 3-9 and 3-10 were measured, and the rates of change of displacement thereof were determined. The results are shown in Table 32. Further, when the Curie temperatures Tc of Examples 3-9 and 3-10 were measured in the same manner as Examples 3-1 and 3-2, both of the Examples obtained favorable values, that is, a Curie temperature of 300° C. or over.

As shown in Table 32, Examples 3-9 and 3-10 obtained a density ρs of 7.8 Mg/m$^3$ or over, a piezoelectric strain constant $d_{31}$ of 200 pC/N or over, a mechanical quality factor $Q_m$ of 100 or less, and small deterioration with time. On the other hand, in Comparative Example 3-9 in which the value of d was less than 0.39 and Comparative Example 3-10 in which the value of d was larger than 0.48, the density ρs, the piezoelectric strain constant $d_{31}$ and the mechanical quality factor $Q_m$ were insufficient, and deterioration with time was large. In other words, it turned out that when zirconium was comprised so that the value of d was within a range of $0.39 \leq d \leq 0.48$, favorable values of the density ρs, the piezoelectric strain constant $d_{31}$, the mechanical quality factor $Q_m$ and the Curie temperature Tc could be obtained, and deterioration with time was small.

EXAMPLES 3-11 through 3-16

Piezoelectric ceramics and piezoelectric devices were produced in the same manner as Example 3-1 and 3-2 except that the composition and the firing temperature were changed as shown in Table 33. At that time, the kind of the sub-component was varied as shown in Table 33, and at least one kind selected from the group consisting of antimony oxide powder, tantalum oxide powder and niobium oxide powder was used as the material. Moreover, as Comparative Examples 3-11 and 3-12 with respect to the Examples, piezoelectric ceramics and piezoelectric devices were produced in the same manner as the Examples except that the composition and the firing temperature were changed as shown in Table 33. In Comparative Example 3-11, no sub-component was comprised, and in Comparative example 3-12, the content of the sub-component was larger than 1.0 mass %. Further, in Comparative Example 3-12, like Example 3-16, antimony was added instead of niobium as the sub-component, and antimony oxide powder was used as the material.

Like Examples 3-1 and 3-2, the densities ρs, the piezoelectric strain constants $d_{31}$i and the mechanical quality factor $Q_m$ of Examples 3-11 through 3-16 and Comparative Examples 3-11 and 3-12 were measured, and the rates of change of displacement thereof were determined. The results are shown in Table 34. Further, when the Curie temperatures Tc of Examples 3-11 through 3-16 were measured in the same manner as Examples 3-1 and 3-2, all of the Examples obtained favorable values, that is, a Curie temperature of 300° C. or over.

As shown in Table 34, Examples 3-11 through 3-16 obtained a density ρs of 7.8 Mg/m$^3$ or over, a piezoelectric strain constant $d_{31}$ of 200 pC/N or over, and small deterioration with time. On the other hand, in Comparative Example 3-11 in which no sub-component was comprised and Comparative Example 3-12 in which the content of the sub-component was larger than 1.0 mass %, the density ρs and the piezoelectric strain constant $d_{31}$ were insufficient, and deterioration with time was large. In other words, it turned out that when 0.1 mass % to 1.0 mass % inclusive of at least one kind selected from the group consisting of antimony, niobium and tantalum in the form of oxide per 1 mol of the main component was comprised as the sub-component, even if the firing temperature was as low as 1050° C. or less, favorable values of the density ρs, the piezoelectric strain constant $d_{31}$, the mechanical quality factor $Q_m$ and the Curie temperature Tc could be obtained, and deterioration with time was small.

EXAMPLES 4-1 and 4-2

Piezoelectric ceramics comprising the oxide represented by Chemical Formula 3 as the main component, nickel as the first sub-component and antimony as the second sub-component were produced. At first, oxide powders were prepared as the materials of the main component, the first sub-component and the second sub-component. Next, after these materials were sufficiently dried, the materials were weighed so that the composition was within the range shown in Chemical Formula 3 and Table 35. Then, the materials were wet-mixed by a ball mill, dried, and pre-fired for 2 hours to 4 hours at 800° C. to 900° C. Then, the pre-fired body was wet-pulverized by the ball mill and dried to prepare pre- fired powder. After that, a polyvinyl alcohol-based binder was added to the pre-fired powder to granulate the powder, and then the granulated body was pressed into the shape of a square approximately 20 mm on a side with a thickness of 1.5 mm by the application of pressure of approximately 196 MPa.

After pressing, the pressed body was fired under air atmosphere at a firing temperature of 950° C. to 1050° C. according to Table 35 for 2 hours to 4 hours. After firing, the obtained sintered body was processed to have a thickness of 1 mm, and electrodes made of silver were formed. After that, the sintered body on which the electrodes were formed was processed to form a 12 mm×3 mm rectangular shape, and then a voltage of 3 kV/mm was applied to the sintered body in 120° C. silicon oil for 30 minutes to carry out polarization. Thereby, the piezoelectric ceramics of Example 4-1 and 4-2 were obtained.

The densities ρs of the piezoelectric ceramics of Examples 4-1 and 4-2 were determined through the Archimedean method. Further, the device capacitances c, resonance frequencies fr and antiresonance frequencies fa thereof were measured by an impedance analyzer, and based on the measured results, the piezoelectric strain constants $d_{31}$ were determined. Moreover, after a piezoelectric ceramic fired in a similar manner was polished and cut to form a 2 mm×4 mm rectangular shape with a thickness of 0.6 mm, the flexural strength thereof was measured by precision load measuring equipment in accordance with JIS (R1601). As the measuring conditions at that time, the distance between supports was 2.0 mm, and the loading speed was 0.5 mm/min. The results are shown in Table 36. In addition, in the results of the flexural strength, examples having a flexural strength of larger than 88 Mpa was evaluated to be favorable, so they were indicated with a symbol "○", and examples having a flexural strength of 88 Mpa or less was indicated with a symbol "x".

Moreover, as Comparative Examples 4-1 and 4-2 with respect to the Examples, piezoelectric ceramics were produced in the same manner as the Examples except that the composition and the firing temperature were changed as shown in Table 35. In Comparative Example 4-1, the value of A in Chemical Formula 3 was less than 0.99, and in Comparative Example 4-2, the value of A was larger than 1.005. Like the Examples, the densities ρs, the piezoelectric strain constants $d_{31}$ and the flexural strengths of the comparative examples 4-1 and 4-2 were measured. The results are also shown in Table 36.

As shown in Table 36, Examples 4-1 and 4-2 obtained a density ρs of 7.8 Mg/m³ or over, a piezoelectric strain constant $d_{31}$ of 200 pC/N or over and a favorable flexural strength. On the other hand, in Comparative Example 3-1 in which the value of A was less than 0.99 and Comparative Example 4-1 in which the value of A was larger than 1.005, the values of the density ρs, the piezoelectric strain constant $d_{31}$ and the flexural strength were insufficient. In other words, it turned out that when the value of A in Chemical Formula 3 was within a range of 0.99≦A≦1.005, the sinterability could be improved, and even if firing is carried out at a low temperature of 1050° C. or less, favorable values of the density ρs, the piezoelectric strain constant $d_{31}$, and the flexural strength could be obtained.

EXAMPLES 4-3 and 4-4

Piezoelectric ceramics were produced in the same manner as Example 4-1 and 4-2 except that the composition and the firing temperature were changed as shown in Table 37. Moreover, as Comparative Examples 4-3 and 4-4 with respect to the Examples, piezoelectric ceramics were produced in the same manner as the Examples except that the composition and the firing temperature were changed as shown in Table 37. In Comparative Example 4-3, the value of a in Chemical Formula 11 3, that is, the composition of zinc and niobium ($Zn_{1/3}Nb_{2/3}$) was less than 0.05, and in Comparative Example 4-4, the value of a was larger than 0.25. Like Examples 4-1 and 4-2, the densities ρs, the piezoelectric strain constants $d_{31}$ and the flexural strengths of Examples 4-3 and 4-4 and Comparative Examples 4-3 and 4-4 were measured. The results are shown in Table 38.

As shown in Table 38, Examples 4-3 and 4-4 obtained a density ρs of 7.8 Mg/m³ or over, a piezoelectric strain constant $d_{31}$ of 200 pC/N or over and a favorable flexural strength. On the other hand, in Comparative Example 4-3 in which the value of a was less than 0.05, the density ρs, the piezoelectric strain constant $d_{31}$ and the flexural strength were insufficient, and in Comparative Example 4-4 in which the value of a was larger than 0.25, the density ρs and the piezoelectric strain constant $d_{31}$ were small. In other words, it turned out that when the value of a in Chemical Formula 3 was within a range of 0.05≦S a≦0.25, even if the firing temperature was as low as 1050° C. or less, superior properties of the density ρs and the piezoelectric strain constant $d_{3}i$ and the flexural strength could be obtained.

EXAMPLES 4-5 and 4-6

Piezoelectric ceramics were produced in the same manner as Example 4-1 and 4-2 except that the composition and the firing temperature were changed as shown in Table 39. Example 4-5 was identical to Example 4-4 in the composition and the firing temperature. Moreover, as Comparative Examples 4-5 and 4-6 with respect to the Examples, piezoelectric ceramics were produced in the same manner as the Examples except that the composition and the firing temperature were changed as shown in Table 39. In Comparative Example 4-5, the value of b in Chemical Formula 3, that is, the composition of titanium was less than 0.35, and in Comparative Example 4-6, the value of b was larger than 0.50. Like Examples 4-1 and 4-2, the densities ρs, the piezoelectric strain constants $d_{31}$ and the flexural strengths of Examples 4-5 and 4-6 and Comparative Examples 4-5 and 4-6 were measured. The results are shown in Table 40.

As shown in Table 40, Examples 4-5 and 4-6 obtained a density ρs of 7.8 Mg/m³ or over, a piezoelectric strain constant $d_{31}$ of 200 pC/N or over and a favorable flexural strength. On the other hand, in Comparative Example 4-5 in which the value of b was less than 0.35 and Comparative Example 4-6 in which the value of b was larger than 0.5, the piezoelectric strain constant $d_{31}$ was insufficient. In other words, it turned out that when titanium was comprised so that the value of b in Chemical Formula 3 was within a range of 0.35≦b≦0.50, favorable values of the density ρs and the piezoelectric strain constant $d_{31}$ and the flexural strength could be obtained.

EXAMPLES 4-7 and 4-8

Piezoelectric ceramics were produced in the same manner as Example 4-1 and 4-2 except that the composition and the firing temperature were changed as shown in Table 41. Moreover, as Comparative Examples 4-7 and 4-8 with respect to the Examples, piezoelectric ceramics were produced in the same manner as the Examples except that the composition and the firing temperature were changed as shown in Table 41. In Comparative Example 4-7, the value of c in Chemical Formula 11 3, that is, the composition of zirconium was less than 0.38, and in Comparative Example 4-8, the value of c was larger than 0.48. Like Examples 4-1 and 4-2, the densities ρs, the piezoelectric strain constants $d_{31}$ and the flexural strengths of Examples 4-7 and 4-8 and Comparative Examples 4-7 and 4-8 were measured. The results are shown in Table 42.

As shown in Table 42, Examples 4-5 and 4-6 obtained a density ρs of 7.8 $Mg/m^3$ or over, a piezoelectric strain constant $d_{31}$ of 200 pC/N or over and a favorable flexural strength. On the other hand, in Comparative Example 4-7 in which the value of c was less than 0.38 and Comparative Example 4-8 in which the value of c was larger than 0.48, the piezoelectric strain constant $d_{31}$ was insufficient. In other words, it turned out that when zirconium was comprised so that the value of c in Chemical Formula 3 was within a range of $0.38 \leq c \leq 0.48$, favorable values of the density ρs, the piezoelectric strain constant $d_{31}$ and flexural strength could be obtained.

EXAMPLES 4-9 and 4-10

Piezoelectric ceramics were produced through the same method as that of Example 4-1 and 4-2 except that the composition and the firing temperature were changed as shown in Table 43. Example 4-9 was identical to Example 4-8 in the composition and the firing temperature. Moreover, as Comparative Examples 4-9 and 4-10 with respect to the Examples, piezoelectric ceramics were produced in the same manner as the Examples except that the composition and the firing temperature were changed as shown in Table 43. In Comparative Example 4-9, the first sub-component was not comprised, and in Comparative Example 4-10, the content of the first sub-component was larger than 0.8 mass %. Like Examples 4-1 and 4-2, the densities ρs, the piezoelectric strain constants $d_{31}$ and the flexural strengths of Examples 4-9 and 4-10 and Comparative Examples 4-9 and 4-10 were measured. The results are shown in Table 44.

As shown in Table 44, Examples 4-9 and 4-10 obtained a density ρs of 7.8 Mg/m3 or over, a piezoelectric strain constant $d_{31}$ of 200 pC/N or over and a favorable flexural strength. On the other hand, in Comparative Example 4-9 in which the first sub-component was not comprised and Comparative Example 4-10 in which the content of the first sub-component was larger than 0.8 mass %, the density ρs, the piezoelectric strain constant $d_{31}$ and the flexural strength were insufficient. In other words, it turned out that when 0.01 mass % to 0.8 mass % inclusive of the first sub-component in the form of oxide per 1 mol of the main component was comprised, even if the firing temperature was reduced to 1050° C. or less, favorable values of the density ρs, the piezoelectric strain constant $d_{31}$ and flexural strength could be obtained.

EXAMPLES 4-11 and 4-12

Piezoelectric ceramics were produced in the same manner as Example 4-1 and 4-2 except that the composition and the firing temperature were changed as shown in Table 45. Example 4-11 was identical to Example 4-6 in the composition and the firing temperature, and Example 4-12 was identical to Example 4-7 in the composition and the firing temperature. Moreover, as Comparative Examples 4-11 and 4-12 with respect to the Examples, piezoelectric ceramics were produced in the same manner as the Examples except that the composition and the firing temperature were changed as shown in Table 45. In Comparative Example 4-11, the second sub-component was not comprised, and in Comparative Example 4-12, the content of the second sub-component was larger than 1.0 mass %. Like Examples 4-1 and 4-2, the densities ρs, the piezoelectric strain constants $d_{31}$ and the flexural strengths of Examples 4-11 and 4-12 and Comparative Examples 4-11 and 4-12 were measured. The results are shown in Table 46.

As shown in Table 46, Examples 4-11 and 4-12 obtained a density ρs of 7.8 $Mg/m^3$ or over, a piezoelectric strain constant $d_{31}$ of 200 pC/N or over and a favorable flexural strength. On the other hand, in Comparative Example 4-11 in which the second sub-component was not comprised and Comparative Example 4-12 in which the content of the second sub-component was larger than 1.0 mass %, the piezoelectric strain constant $d_{31}$ and the flexural strength were insufficient. In other words, it turned out that when 0.01 mass % to 0.8 mass % inclusive of the second sub-component in the form of oxide per 1 mol of the main component was comprised, even if the firing temperature was as low as 1050° C. or less, favorable values of the piezoelectric strain constant $d_{31}$ and flexural strength could be obtained.

EXAMPLES 4-13 through 4-16

Piezoelectric ceramics were produced in the same manner as Examples 4-1 and 4-2 except that the composition and the firing temperature were changed as shown in Table 47. Like Examples 4-1 and 4-2, the densities ρs, the piezoelectric strain constants $d_{31}$ and the flexural strengths of Examples 4-13 through 4-16 were measured. The results are shown in Table 48.

As shown in Table 48, Examples 4-13 through 4-16 obtained a density ρs of 7.8 $Mg/m^3$ or over, a piezoelectric strain constant $d_{31}$ of 200 pC/N or over and a favorable flexural strength. In other words, it turned out that when at least one kind selected from the group consisting of iron, cobalt, nickel and copper was comprised as the first sub-component, and at least one kind selected from the group consisting of antimony, niobium and tantalum was comprised as the second sub-component, similar results could be obtained.

EXAMPLES 5-1 and 5-2

Piezoelectric ceramics were produced in the same manner as Examples 4-1 and 4-2 except that the oxide represented by Chemical Formula 4 was comprised as the main component, and the composition and the firing temperature were changed as shown in Chemical Formula 4 and Table 49. At that time, carbonate was used as the material of Me in Chemical Formula 4. Moreover, as Comparative Examples 5-1 and 5-2 with respect to the Examples, piezoelectric ceramics were produced in the same manner as the Examples except that the composition and the firing temperature were changed as shown in Table 49. In Comparative Example 5-1, the value of A in Chemical Formula 4 was less than 0.99, and in Comparative Example 5-2, the value of A was larger than 1.005. Like Examples 4-1 and 4-2, the densities ρs, the piezoelectric strain constants $d_{31}$ and the flexural strengths of Examples 5-1 and 5-2 and Comparative Examples 5-1 and 5-2 were measured. The results are shown in Table 50.

As shown in Table 50, Examples 5-1 and 5-2 obtained a density ρs of 7.8 Mg/m³ or over, a piezoelectric strain constant $d_{31}$ of 200 pC/N or over and a favorable flexural strength. On the other hand, in Comparative Example 5-1 in which the value of A was less than 0.99 and Comparative Example 5-2 in which the value of A was larger than 1.005, the values of the density ρs, the piezoelectric strain constant $d_{31}$ and the flexural strength were insufficient. In other words, it turned out that when the value of A in Chemical Formula 4 was within a range of 0.99≦A≦1.005, the sinterability could be improved, and even if firing was carried out at a low temperature of 1050° C. or less, favorable values of the density ρs, the piezoelectric strain constant $d_{31}$ and the flexural strength could be obtained.

EXAMPLES 5-3 and 5-4

Piezoelectric ceramics were produced in the same manner as Examples 5-1 and 5-2 except that the composition and the firing temperature were changed as shown in Table 51. Moreover, as Comparative example 5-3 with respect to the Examples, a piezoelectric ceramic was produced in the same manner as the Examples except that the composition and the firing temperature were changed as shown in Table 51. In Comparative Example 5 3, Me in Chemical Formula 4 was barium, and the composition B thereof was larger than 0.1. Like Examples 4-1 and 4-2, the densities ρs and the piezoelectric strain constants $d_{31}$ of Examples 5-3 and 5-4 and Comparative Example 5-3 were measured. The results are shown in Table 52.

As shown in Table 52, Examples 5-3 and 5-4 obtained a density ρs of 7.8 Mg/m³ or over, a piezoelectric strain constant $d_{31}$ of 200 pC/N or over and a favorable flexural strength. On the other hand, in Comparative Example 5-3 in which the value of B was larger than 0.1, the values of the density ρs, the piezoelectric strain constant $d_{31}$ and the flexural strength were insufficient. Further, as can be seen from the comparison between Examples 5-3 and 4-3 (refer to Tables 37 and 38), Example 5-3 in which a part of lead was replaced with calcium could obtain a larger piezoelectric strain constant $d_{31}$.

In other words, it turned out that when a part of lead was replaced with strontium, calcium or barium, and the replaced amount, that is, the value of B in Chemical Formula 4 was within a range of 0.005≦B≦0.1, the piezoelectric strain constant $d_{31}$ could be further improved.

EXAMPLES 5-5 and 5-6

Piezoelectric ceramics were produced in the same manner as Examples 5-1 and 5-2 except that the composition and the firing temperature were changed as shown in Table 53. Example 5-5 was identical to Example 5-3 in the composition and the firing temperature. Moreover, as Comparative examples 5-4 and 5-5 with respect to the Examples, piezoelectric ceramics were produced in the same manner as the Examples except that the composition and the firing temperature were changed as shown in Table 53. In Comparative Example 5-4, the value of a in Chemical Formula 4, that is, the composition of zinc and niobium ($Zn_{1/3}Nb_{2/3}$) was less than 0.05, and in Comparative Example 5-5, the value of a was larger than 0.25. Like Examples 4-1 and 4-2, the densities ρs, the piezoelectric strain constants $d_{31}$ and the flexural strengths of Examples 5-5 and 5-6 and Comparative Examples 5-4 and 5-5 were measured. The results are shown in Table 54.

As shown in Table 54, Examples 5-5 and 5-6 obtained a density ρs of 7.8 Mg/m³ or over, a piezoelectric strain constant $d_{31}$ of 200 pC/N or over and a favorable flexural strength. On the other hand, in Comparative Example 5-4 in which the value of a is less than 0.05, the density ρs, the piezoelectric strain constant $d_{31}$ and the flexural strength were insufficient, and in Comparative Example 5-5 in which the value of a was larger than 0.25, the density ρs and the piezoelectric strain constant $d_{31}$ were small. In other words, it turned out that in the case where the value of a in Chemical Formula 4 was within a range of 0.05≦a≦0.25, even if the firing temperature was as low as 1050° C. or less, superior properties of the density ρs, the piezoelectric strain constant $d_{31}$ and the flexural strength could be obtained.

EXAMPLES 5-7 and 5-8

Piezoelectric ceramics were produced in the same manner as Examples 5-1 and 5-2 except that the composition and the firing temperature were changed as shown in Table 55. Example 5-7 was identical to Example 5-6 in the composition and the firing temperature. Moreover, as Comparative examples 5-6 and 5-7 with respect to the Examples, piezoelectric ceramics were produced in the same manner as the Examples except that the composition and the firing temperature were changed as shown in Table 55. In Comparative Example 5-6, the value of b in Chemical Formula 4, that is, the composition of titanium was less than 0.35, and in Comparative Example 5-7, the value of b was larger than 0.50. Like Examples 4-1 and 4-2, the densities ps, the piezoelectric strain constants $d_{31}$ and the flexural strengths of Examples 5-7 and 5-8 and Comparative Examples 5-6 and 5-7 were measured. The results are shown in Table 56.

As shown in Table 56, Examples 5-7 and 5-8 obtained a density ρs of 7.8 Mg/m³ or over, a piezoelectric strain constant $d_{31}$ of 200 pC/N or over and a favorable flexural strength. On the other hand, in Comparative Example 5-6 in which the value of b was less than 0.35 and Comparative Example 5-7 in which the value of b was larger than 0.50, the piezoelectric strain constant $d_{31}$ was insufficient. In other words, it turned out that when titanium was comprised so that the value of b in Chemical Formula 4 was within a range of 0.35≦b≦0.50, favorable values of the density ρs, the piezoelectric strain constant $d_{31}$ and the flexural strength could be obtained.

EXAMPLES 5-9 and 5-10

Piezoelectric ceramics were produced in the same manner as Examples 5-1 and 5-2 except that the composition and the firing temperature were changed as shown in Table 57. Moreover, as Comparative examples 5-8 and 5-9 with respect to the Examples, piezoelectric ceramics were produced in the same manner as the Examples except that the composition and the firing temperature were changed as shown in Table 57. In Comparative example 5-8, the value of c in Chemical Formula 4, that is, the composition of zirconium was less than 0.38, and in Comparative Example 5-9, the value of c was larger than 0.48. Like Examples 4-1 and 4-2, the densities ρs, the piezoelectric strain constants $d_{31}$ and the flexural strengths of Examples 5-9 and 5-10 and Comparative Examples 5-8 and 5-9 were measured. The results are shown in Table 58.

As shown in Table 58, Examples 5-9 and 5-10 obtained a density ρs of 7.8 Mg/m³ or over, a piezoelectric strain constant $d_{31}$ of 200 pC/N or over and a favorable flexural strength. On the other hand, in Comparative Example 5-8 in which the value of c was less than 0.38 and Comparative Example 5-9 in which the value of c was larger than 0.48, the piezoelectric strain constant $d_{31}$ was insufficient. In other words, it turned out that when zirconium was comprised so that the value of c in Chemical Formula 4 was within a range of $0.38 \leq c \leq 0.48$, favorable values of the density ρs, the piezoelectric strain constant $d_{31}$ and the flexural strength could be obtained.

EXAMPLES 5-11 and 5-12

Piezoelectric ceramics were produced in the same manner as Examples 5-1 and 5-2 except that the composition and the firing temperature were changed as shown in Table 59. Example 5-11 was identical to Example 5-10 in the composition and the firing temperature. Moreover, as Comparative examples 5-10 and 5-11 with respect to the Examples, piezoelectric ceramics were produced in the same manner as the Examples except that the composition and the firing temperature were changed as shown in Table 59. In Comparative Example 5-10, the first sub-component was not comprised, and in Comparative Example 5-11, the content of the first sub-component was larger than 0.8 mass %. Like Examples 4-1 and 4-2, the densities ρs, the piezoelectric strain constants $d_{31}$ and the flexural strengths of Examples 5-11 and 5-12 and Comparative Examples 5-10 and 5-11 were measured. The results are shown in Table 60.

As shown in Table 60, Examples 5-11 and 5-12 obtained a density ρs of 7.8 $Mg/m^3$ or over, a piezoelectric strain constant $d_{31}$ of 200 pC/N or over and a favorable flexural strength. On the other hand, in Comparative Example 5-10 in which the first sub-component was not comprised and Comparative example 5-11 in which the content of the first sub-component was larger than 0.8 mass %, the density ρs, the piezoelectric strain constant $d_{31}$ and the flexural strength were insufficient. In other words, it turned out that in the case where 0.01 mass % to 0.8 mass % inclusive of the first sub-component in the form of oxide per 1 mol of the main component was comprised, even if the firing temperature was as low as 1050° C. or less, favorable values of the density ρs, the piezoelectric strain constant $d_{31}$ and the flexural strength could be obtained.

EXAMPLES 5-13 and 5-14

Piezoelectric ceramics were produced in the same manner as Examples 5-1 and 5-2 except that the composition and the firing temperature were changed as shown in Table 61. Example 5-13 was identical to Example 5-8 in the composition and the firing temperature, and Example 5-14 was identical to Example 5-9 in the composition and the firing temperature. Moreover, as Comparative examples 5-12 and 5-13 with respect to the Examples, piezoelectric ceramics were produced in the same manner as the Examples except that the composition and the firing temperature were changed as shown in Table 61. In Comparative Example 5-12, the second sub-component was not comprised, and in Comparative Example 5-13, the content of the second sub-component was larger than 1.0 mass %. Like Examples 4-1 and 4-2, the densities ρs, the piezoelectric strain constants $d_{31}$ and the flexural strengths of Examples 5-13 and 5-14 and Comparative Examples 5-12 and 5-13 were measured. The results are shown in Table 62.

As shown in Table 62, Examples 5-13 and 5-14 obtained a density ρs of 7.8 $Mg/m^3$ or over, a piezoelectric strain constant $d_{31}$ of 200 pC/N or over and a favorable flexural strength. On the other hand, in Comparative Example 5-12 in which the second sub-component was not comprised and Comparative Example 5-13 in which the content of the second sub-component was larger than 1.0 mass %, the piezoelectric strain constant $d_{31}$ and the flexural strength were insufficient. In other words, it turned out that in the case where 0.01 mass % to 0.8 mass % inclusive of the second sub-component in the form of oxide per 1 mol of the main component was comprised, even if the firing temperature was as low as 1050° C. or less, favorable values of the piezoelectric strain constant $d_{31}$ and the flexural strength could be obtained.

EXAMPLES 5-15 through 5-19

Piezoelectric ceramics were produced in the same manner as Examples 5-1 and 5-2 except that the composition and the firing temperature were changed as shown in Table 63. Like Examples 4-1 and 4-2, the densities ρs, the piezoelectric strain constants $d_{31}$ and the flexural strengths of Examples 5-15 through 5-19 were measured. The results are shown in Table 64.

As shown in Table 64, Examples 5-15 through 5-19 obtained a density ρs of 7.8 $Mg/m^3$ or over, a piezoelectric strain constant $d_{31}$ of 200 pC/N or over and a favorable flexural strength. In other words, it turned out that when a part of lead was replaced with at least one kind selected from the group consisting of strontium, calcium and barium, and at least one kind selected from the group consisting of iron, cobalt, nickel and copper was comprised as the first sub-component, and at least one kind selected from the group consisting of antimony, niobium and tantalum was comprised as the second sub-component, similar results could be obtained.

Although descriptions are given in detail referring to some examples, as long as the compositions of the main component and the sub-components are changed within a range described in the above embodiments, similar results can be obtained.

Although the present invention is described above referring to the embodiments and the examples, the invention is not limited to the above embodiments and examples, and is applicable to various modifications. For example, in the first embodiment and Examples 1-1 through 1-27 and Examples 2-1 through 2-22, the case of comprising the main component represented by Chemical Formula 1 or Chemical Formula 2 and the first sub-component of at least one kind selected from the group consisting of iron, cobalt, nickel and copper and optionally the second sub-component of at least one kind selected from the group consisting of antimony, niobium and tantalum and/or the third sub-component of at least one kind selected from the group consisting of sodium and potassium is described, however, any other component may be comprised in addition to the above components. In this case, like the first sub-component, the second component and the third component, the other component may or may not form a solid solution to be contained in the main component.

Moreover, in the second embodiment and Examples 3-1 through 3-16, the case of comprising the main component represented by Chemical Formula 5, the sub-component of at least one kind selected from the group consisting of antimony, niobium and tantalum is described, however, any other component may be comprised in addition to the above components. In this case, like the above sub-component, the other component may or may not form a solid solution to be contained in the main component.

Further, in the third embodiment and Examples 4-1 through 4-12 and Examples 5-1 through 5-14, the case of comprising the main component represented by Chemical Formula 3 or Chemical Formula 4, the first sub-component of at least one kind selected from the group consisting of iron, cobalt, nickel and copper and the second sub-component of at least one kind selected from the group consisting of antimony, niobium and tantalum is described, however, any other component may be comprised in addition to the above components. In this case, like the first sub-component and the second sub-component, the other component may or may not form a solid solution to be contained in the main component.

Still further, in the above embodiments, the multilayer piezoelectric device is described, however, the invention is applicable to a piezoelectric device having any other structure such as a single-plate type.

As described above, according to the piezoelectric ceramic or the piezoelectric device of the invention, the oxide represented by Chemical Formula 1 or Chemical Formula 2 as the main component and a predetermined amount of at least one kind selected from the group consisting of iron, cobalt, nickel and copper as the first sub-component are comprised, so a larger piezoelectric strain constant can be obtained, and the firing temperature can be reduced to 1050° C. or less. Therefore, when the multilayer piezoelectric device, for example, is formed, a lower-cost material such as a silver-palladium alloy containing a small amount of palladium can be used for the internal electrodes, and thereby the piezoelectric device which is lower-cost and smaller in size than the conventional one can be obtained.

More specifically, according to the piezoelectric ceramic or the piezoelectric device of an aspect of the invention, the oxide represented by Chemical Formula 2 in which a part of lead is replaced with at least one kind selected from the group consisting of calcium, strontium and barium is comprised as the main component, so a larger piezoelectric strain constant can be obtained.

Moreover, according to the piezoelectric ceramic or the piezoelectric device of another aspect of the invention, a predetermined amount of at least one kind selected from the group consisting of antimony, niobium and tantalum is comprised as the second sub-component, so while the firing temperature can be maintained low, the properties can be further improved.

Further, according to the piezoelectric ceramic or the piezoelectric device of still another aspect of the invention, a predetermined amount of at least one kind selected from the group consisting of sodium and potassium is comprised as the third sub-component, so the firing temperature can be further reduced to, for example, 1000° C. or less.

In addition, according to a method of manufacturing the piezoelectric ceramic of a further aspect of the invention, a mixture of the elements constituting the main component and a predetermined amount of at least one kind selected from the group consisting of iron, cobalt, nickel and copper as the first sub-component is fired, so the piezoelectric ceramic of the invention can be easily obtained.

Further, according to the piezoelectric ceramic or the piezoelectric device of a still further aspect of the invention, the oxide represented by Chemical Formula 5 as the main component and a predetermined amount of at least one kind selected from the group consisting of antimony, niobium and tantalum as the sub-component are comprised, so a larger piezoelectric strain constant and a higher Curie temperature can be obtained, and deterioration in properties with time can be inhibited, and the firing temperature can be reduced. Therefore, when the multilayer piezoelectric device is formed, a lower-cost material such as a silver-palladium alloy containing a small amount of palladium can be used for the internal electrodes. Thereby, the piezoelectric device which is lower-cost and more reliable than the conventional one can be obtained.

Moreover, according to the piezoelectric ceramic or the piezoelectric device of a still aspect of the invention, the oxide represented by Chemical Formula 3 or Chemical Formula 4 as the main component, a predetermined amount of at least one kind selected from the group consisting of iron, cobalt, nickel and copper as the first sub-component and a predetermined amount of at least one kind selected from the group consisting of antimony, niobium and tantalum as the second sub-component are comprised, so while a larger piezoelectric strain constant and a larger mechanical strength can be obtained, the firing temperature can be reduced to, for example, 1050° C. or less. Therefore, when the multilayer piezoelectric device is formed, a lower-cost material such as a silver-palladium alloy containing a small amount of palladium can be used for the internal electrodes, and thereby the piezoelectric device which is lower-cost and smaller in size than the conventional one can be obtained.

Obviously many modifications and variations of the present invention are possible in the light of the above teachings. It is therefore to be understood that within the scope of the appended claims the invention may be practiced otherwise than as specifically described.

$$Pb_A[(Mg_{1/3}Nb_{2/3})_a(Zn_{1/3}Nb_{2/3})_bTi_cZr_d]O_3 \quad \text{(Chemical Formula 1)}$$

where the values of A, a, b, c and d are within a range satisfying a+b+c+d=1, $0.99 \leq A \leq 1.01$, $0.15 \leq a+b \leq 0.5$, $0.05 \leq b \leq 0.25$, $0.2 \leq c \leq 0.5$, $0.15 \leq d \leq 0.6$, respectively.

$$(Pb_{A-B}Me_B)[(Mg_{1/3}Nb_{2/3})_a(Zn_{1/3}Nb_{2/3})_bTi_cZr_d]O_3$$
$$\text{(Chemical Formula 2)}$$

where the values of A, B, a, b, c and d are within a range satisfying a+b+c+d=1, $0.99 \leq A \leq 1.01$, $0.005 \leq B \leq 0.1$, $0.15 \leq a+b \leq 0.5$, $0.05 \leq b \leq 0.25$, $0.2 \leq c \leq 0.5$, $0.15 \leq d \leq 0.6$, respectively. Me represents at least one kind selected from the group consisting of calcium, strontium and barium.

$$Pb_A[(Zn_{1/3}Nb_{2/3})_aTi_bZr_c]O_3 \quad \text{(Chemical Formula 3)}$$

where the values of A, a, b and c are within a range satisfying a+b+c=1, $0.99 \leq A \leq 1.005$. $0.05 \leq a \leq 0.25$, $0.35 \leq b \leq 0.50$, $0.38 \leq c \leq 0.48$, respectively, $$(Pb_{A-B}Me_B)[(Zn_{1/3}Nb_{2/3})_aTi_bZr_c]O_3 \quad \text{(Chemical Formula 4)}$$

where the values of A, B, a, b and c are within a range satisfying a+b+c=1, $0.99 \leq A \leq 1.005$, $0.05 \leq B \leq 0.1$, $0.05 \leq a \leq 0.25$, $0.35 \leq b \leq 0.50$, $0.38 \leq c \leq 0.48$ respectively. Me represents at least one kind selected from the group consisting of calcium, strontium and barium.

$$Pb_A[(CO_{1/3}Nb_{2/3})_a(Zn1/3Nb_{2/3})_bTi_cZr_d]_BO_3 \quad \text{(Chemical Formula 5)}$$

where the values of A, B, a, b, c and d are within a range satisfying a+b+c+d=1, $0.99 \leq A/B \leq 1.005$, $0.005a \leq 0.03$, $0.05 \leq b \leq 0.2$, $0.36 \leq c \leq 0.49$, $0.39 \leq d \leq 0.48$, respectively.

TABLE 1

| | COMPOSITION | | | | | | | | FIRING TEMPERATURE (° C.) |
|---|---|---|---|---|---|---|---|---|---|
| | | | | | | FIRST SUB-COMPONENT | | SECOND SUB-COMPONENT | |
| | A (mol) | a + b (mol) | b (mol) | c (mol) | d (mol) | KIND | CONTENT (mass %) | KIND | CONTENT (mass %) | |
| EXAMPLE 1-1 | 0.99 | 0.26 | 0.12 | 0.376 | 0.364 | Fe$_2$O$_3$ | 0.3 | — | 0 | 1050 |
| EXAMPLE 1-2 | 1.01 | 0.26 | 0.12 | 0.384 | 0.356 | Fe$_2$O$_3$ | 0.3 | — | 0 | 1010 |
| COMPARATIVE EXAMPLE 1-1 | 0.98 | 0.26 | 0.12 | 0.376 | 0.364 | Fe$_2$O$_3$ | 0.3 | — | 0 | 1050 |
| COMPARATIVE EXAMPLE 1-2 | 1.02 | 0.26 | 0.12 | 0.384 | 0.356 | Fe$_2$O$_3$ | 0.3 | — | 0 | 1010 |

TABLE 2

| | DENSITY ρs (Mg/m$^2$) | PIEZOELECTRIC STRAIN CONSTANT d$_{33}$ (pC/N) |
|---|---|---|
| EXAMPLE 1-1 | 7.80 | 550 |
| EXAMPLE 1-2 | 7.81 | 560 |
| COMPARATIVE EXAMPLE 1-1 | 7.18 | unmeasurable |
| COMPARATIVE EXAMPLE 1-2 | 7.50 | 410 |

TABLE 3

| | COMPOSITION | | | | | | | | FIRING TEMPERATURE (° C.) |
|---|---|---|---|---|---|---|---|---|---|
| | | | | | | FIRST SUB-COMPONENT | | SECOND SUB-COMPONENT | |
| | A (mol) | a + b (mol) | b (mol) | c (mol) | d (mol) | KIND | CONTENT (mass %) | KIND | CONTENT (mass %) | |
| EXAMPLE 1-3 | 1.00 | 0.26 | 0.05 | 0.382 | 0.358 | NiO | 0.4 | — | 0 | 1050 |
| EXAMPLE 1-4 | 1.00 | 0.40 | 0.25 | 0.310 | 0.290 | NiO | 0.4 | — | 0 | 1010 |
| COMPARATIVE EXAMPLE 1-3 | 1.00 | 0.26 | 0 | 0.384 | 0.356 | NiO | 0.4 | — | 0 | 1050 |
| COMPARATIVE EXAMPLE 1-4 | 1.00 | 0.40 | 0.30 | 0.310 | 0.290 | NiO | 0.4 | — | 0 | 1050 |

TABLE 4

| | DENSITY ρs (Mg/m$^3$) | PIEZOELECTRIC STRAIN CONSTANT d$_{33}$ (pC/N) |
|---|---|---|
| EXAMPLE 1-3 | 7.80 | 550 |
| EXAMPLE 1-4 | 7.85 | 560 |
| COMPARATIVE EXAMPLE 1-3 | 7.20 | unmeasurable |
| COMPARATIVE EXAMPLE 1-4 | 7.17 | unmeasurable |

TABLE 5

| | COMPOSITION | | | | | | | | FIRING |
|---|---|---|---|---|---|---|---|---|---|
| | | | | | | FIRST SUB-COMPONENT | | SECOND SUB-COMPONENT | |
| | A (mol) | a + b (mol) | b (mol) | c (mol) | d (mol) | KIND | CONTENT (mass %) | KIND | CONTENT (mass %) | TEMPERATURE (° C.) |
| EXAMPLE 1-5 | 1.00 | 0.26 | 0.12 | 0.380 | 0.360 | CuO | 0.01 | — | 0 | 1050 |
| EXAMPLE 1-6 | 1.00 | 0.26 | 0.12 | 0.374 | 0.366 | NiO | 0.8 | — | 0 | 990 |
| EXAMPLE 1-7 | 1.00 | 0.26 | 0.12 | 0.378 | 0.362 | CoO | 0.2 | — | 0 | 1010 |
| EXAMPLE 1-8 | 1.00 | 0.26 | 0.12 | 0.378 | 0.362 | CuO | 0.1 | — | 0 | 1010 |
| EXAMPLE 1-9 | 1.00 | 0.26 | 0.12 | 0.377 | 0.363 | NiO $Fe_2O_3$ | 0.2 0.2 | — | 0 | 1010 |
| EXAMPLE 1-10 | 1.00 | 0.26 | 0.12 | 0.377 | 0.363 | CoO NiO | 0.1 0.3 | — | 0 | 1010 |
| COMPARATIVE EXAMPLE 1-5 | 1.00 | 0.26 | 0.12 | 0.380 | 0.360 | — | 0 | — | 0 | 1050 |
| COMPARATIVE EXAMPLE 1-6 | 1.00 | 0.26 | 0.12 | 0.374 | 0.366 | NiO | 1.2 | — | 0 | 990 |

TABLE 6

| | DENSITY ρs (Mg/m$^3$) | PIEZOELECTRIC STRAIN CONSTANT $d_{33}$ (pC/N) |
|---|---|---|
| EXAMPLE 1-5 | 7.80 | 550 |
| EXAMPLE 1-6 | 7.86 | 560 |
| EXAMPLE 1-7 | 7.85 | 550 |
| EXAMPLE 1-8 | 7.88 | 550 |
| EXAMPLE 1-9 | 7.88 | 560 |
| EXAMPLE 1-10 | 7.90 | 560 |
| COMPARATIVE EXAMPLE 1-5 | 7.19 | unmeasurable |
| COMPARATIVE EXAMPLE 1-6 | 7.56 | 490 |

TABLE 7

| | COMPOSITION | | | | | | | | FIRING |
|---|---|---|---|---|---|---|---|---|---|
| | | | | | | FIRST SUB-COMPONENT | | SECOND SUB-COMPONENT | |
| | A (mol) | a + b (mol) | b (mol) | c (mol) | d (mol) | KIND | CONTENT (mass %) | KIND | CONTENT (mass %) | TEMPERATURE (° C.) |
| EXAMPLE 1-11 | 1.00 | 0.26 | 0.12 | 0.377 | 0.363 | $Fe_2O_3$ | 0.3 | $Sb_2O_3$ | 0.5 | 1040 |
| EXAMPLE 1-12 | 1.00 | 0.26 | 0.12 | 0.377 | 0.363 | $Fe_2O_3$ | 0.3 | $Nb_2O_5$ | 0.5 | 1040 |
| EXAMPLE 1-13 | 1.00 | 0.26 | 0.12 | 0.378 | 0.362 | CoO | 0.2 | $Ta_2O_5$ | 0.05 | 1010 |
| EXAMPLE 1-14 | 1.00 | 0.26 | 0.12 | 0.372 | 0.364 | $Fe_2O_3$ | 0.3 | $Sb_2O_3$ | 1.0 | 1050 |
| EXAMPLE 1-15 | 1.00 | 0.40 | 0.16 | 0.320 | 0.280 | NiO | 0.4 | $Nb_2O_5$ | 0.1 | 960 |
| EXAMPLE 1-16 | 1.00 | 0.26 | 0.12 | 0.376 | 0.364 | CoO | 0.2 | $Sb_2O_3$ $Nb_2O_5$ | 0.2 0.2 | 1020 |
| EXAMPLE 1-17 | 1.00 | 0.26 | 0.12 | 0.376 | 0.364 | NiO $Fe_2O_3$ | 0.2 0.2 | $Ta_2O_5$ $Nb_2O_5$ | 0.2 0.2 | 1020 |
| EXAMPLE 1-18 | 1.00 | 0.26 | 0.12 | 0.376 | 0.364 | CoO $Fe_2O_3$ | 0.1 0.2 | $Sb_2O_3$ $Ta_2O_5$ | 0.2 0.2 | 1020 |
| EXAMPLE 1-19 | 1.00 | 0.26 | 0.12 | 0.377 | 0.363 | NiO | 0.4 | $Sb_2O_3$ $Nb_2O_5$ $Ta_2O_5$ | 0.1 0.1 0.1 | 1020 |
| EXAMPLE 1-20 | 1.00 | 0.26 | 0.12 | 0.377 | 0.363 | NiO $Fe_2O_3$ CuO | 0.2 0.15 0.05 | $Sb_2O_3$ $Nb_2O_5$ $Ta_2O_5$ | 0.1 0.1 0.1 | 1020 |
| COMPARATIVE EXAMPLE 1-7 | 1.00 | 0.26 | 0.12 | 0.368 | 0.372 | $Fe_2O_3$ | 0.3 | $Sb_2O_3$ | 1.5 | 1050 |

TABLE 8

|  | DENSITY ρs (Mg/m³) | PIEZOELECTRIC STRAIN CONSTANT $d_{33}$ (pC/N) |
|---|---|---|
| EXAMPLE 1-11 | 7.87 | 600 |
| EXAMPLE 1-12 | 7.89 | 600 |
| EXAMPLE 1-13 | 7.82 | 580 |
| EXAMPLE 1-14 | 7.80 | 560 |
| EXAMPLE 1-15 | 7.88 | 600 |
| EXAMPLE 1-16 | 7.88 | 590 |
| EXAMPLE 1-17 | 7.86 | 600 |
| EXAMPLE 1-18 | 7.85 | 590 |
| EXAMPLE 1-19 | 7.91 | 600 |
| EXAMPLE 1-20 | 7.84 | 590 |
| COMPARATIVE EXAMPLE 1-7 | 6.98 | unmeasurable |

TABLE 9

| | COMPOSITION | | | | | | | | | |
|---|---|---|---|---|---|---|---|---|---|---|
| | A | a + b | b | c | d | FIRST SUB-COMPONENT | | SECOND SUB-COMPONENT | | THIRD SUB-COMPONENT | |
| | (mol) | (mol) | (mol) | (mol) | (mol) | KIND | CONTENT | KIND | CONTENT | KIND | CONTENT |
| EXAMPLE 1-21 | 1.00 | 0.26 | 0.12 | 0.374 | 0.366 | NiO | 0.8 | — | 0 | $K_2O$ | 0.05 |
| EXAMPLE 1-22 | 1.00 | 0.26 | 0.12 | 0.377 | 0.363 | $Fe_2O_3$ | 0.3 | $Nb_2O_5$ | 0.5 | $Na_2O$ | 0.01 |
| EXAMPLE 1-23 | 1.00 | 0.26 | 0.12 | 0.377 | 0.363 | $Fe_2O_3$ | 0.3 | $Nb_2O_5$ | 0.5 | $Na_2O$ | 0.05 |
| EXAMPLE 1-24 | 1.00 | 0.26 | 0.12 | 0.377 | 0.363 | $Fe_2O_3$ | 0.3 | $Nb_2O_5$ | 0.5 | $K_2O$ | 0.10 |
| EXAMPLE 1-25 | 1.00 | 0.26 | 0.12 | 0.377 | 0.363 | $Fe_2O_3$ | 0.3 | $Nb_2O_5$ | 0.5 | $K_2O$ $Na_2O$ | 0.03 0.02 |
| EXAMPLE 1-26 | 1.00 | 0.26 | 0.12 | 0.378 | 0.362 | CoO | 0.2 | $Ta_2O_5$ | 0.05 | $K_2O$ | 0.05 |
| EXAMPLE 1-27 | 1.00 | 0.40 | 0.16 | 0.320 | 0.280 | NiO | 0.4 | $Nb_2O_5$ | 0.5 | $Na_2O$ | 0.05 |
| COMPARATIVE EXAMPLE 1-8 | 1.00 | 0.26 | 0.12 | 0.377 | 0.363 | $Fe_2O_3$ | 0.3 | $Nb_2O_5$ | 0.5 | $K_2O$ | 0.15 |
| REFERENCE EXAMPLE 1-1 | 1.00 | 0.26 | 0.12 | 0.374 | 0.366 | NiO | 0.8 | — | 0 | — | 0 |
| REFERENCE EXAMPLE 1-2 | 1.00 | 0.26 | 0.12 | 0.377 | 0.363 | $Fe_2O_3$ | 0.3 | $Nb_2O_5$ | 0.5 | — | 0 |
| REFERENCE EXAMPLE 1-3 | 1.00 | 0.26 | 0.12 | 0.378 | 0.362 | CoO | 0.2 | $Ta_2O_5$ | 0.05 | — | 0 |
| REFERENCE EXAMPLE 1-4 | 1.00 | 0.40 | 0.16 | 0.320 | 0.280 | NiO | 0.4 | $Nb_2O_5$ | 0.5 | — | 0 |

Note:
The contents of the first sub-component, the second sub-component and the third sub-component are expressed in mass %.

TABLE 10

| | FIRING TEMPERATURE (° C.) | DENSITY ρs (Mg/m³) | PIEZOELECTRIC STRAIN CONSTANT $d_{33}$ (pC/N) |
|---|---|---|---|
| EXAMPLE 1-21 | 930 | 7.84 | 560 |
| EXAMPLE 1-22 | 980 | 7.88 | 600 |
| EXAMPLE 1-23 | 960 | 7.85 | 600 |
| EXAMPLE 1-24 | 960 | 7.80 | 600 |
| EXAMPLE 1-25 | 960 | 7.83 | 600 |
| EXAMPLE 1-26 | 950 | 7.80 | 600 |
| EXAMPLE 1-27 | 900 | 7.83 | 600 |
| COMPARATIVE EXAMPLE 1-8 | 960 | 7.40 | unmeasurable |
| REFERENCE EXAMPLE 1-1 | 930 | 7.09 | unmeasurable |
| REFERENCE EXAMPLE 1-2 | 980 | 7.19 | unmeasurable |
| REFERENCE EXAMPLE 1-3 | 950 | 7.11 | unmeasurable |
| REFERENCE EXAMPLE 1-4 | 900 | 7.08 | unmeasurable |

TABLE 11

| | A (mol) | Me | B (mol) | a + b (mol) | b (mol) | c (mol) | d (mol) | FIRST SUB-COMPONENT KIND | FIRST SUB-COMPONENT CONTENT (mass %) | SECOND SUB-COMPONENT KIND | SECOND SUB-COMPONENT CONTENT (mass %) | FIRING TEMPERATURE (° C.) |
|---|---|---|---|---|---|---|---|---|---|---|---|---|
| EXAMPLE 2-1 | 0.99 | Sr | 0.05 | 0.26 | 0.12 | 0.374 | 0.366 | $Fe_2O_3$ | 0.3 | — | 0 | 1050 |
| EXAMPLE 2-2 | 1.01 | Sr | 0.05 | 0.26 | 0.12 | 0.382 | 0.358 | $Fe_2O_3$ | 0.3 | — | 0 | 1010 |
| COMPARATIVE EXAMPLE 2-1 | 0.98 | Sr | 0.05 | 0.26 | 0.12 | 0.374 | 0.366 | $Fe_2O_3$ | 0.3 | — | 0 | 1050 |
| COMPARATIVE EXAMPLE 2-2 | 1.02 | Sr | 0.05 | 0.26 | 0.12 | 0.382 | 0.358 | $Fe_2O_3$ | 0.3 | — | 0 | 1010 |

TABLE 12

| | DENSITY ρs ($Mg/m^3$) | PIEZOELECTRIC STRAIN CONSTANT $d_{33}$ (pC/N) |
|---|---|---|
| EXAMPLE 2-1 | 7.80 | 600 |
| EXAMPLE 2-2 | 7.80 | 610 |
| COMPARATIVE EXAMPLE 2-1 | 7.18 | unmeasurable |
| COMPARATIVE EXAMPLE 2-2 | 7.42 | 400 |

TABLE 13

| | A (mol) | Me | B (mol) | a + b (mol) | b (mol) | c (mol) | d (mol) | FIRST SUB-COMPONENT KIND | FIRST SUB-COMPONENT CONTENT (mass %) | SECOND SUB-COMPONENT KIND | SECOND SUB-COMPONENT CONTENT (mass %) | FIRING TEMPERATURE (° C.) |
|---|---|---|---|---|---|---|---|---|---|---|---|---|
| EXAMPLE 2-3 | 1.00 | Ca | 0.005 | 0.26 | 0.12 | 0.378 | 0.362 | CuO | 0.1 | — | 0 | 1010 |
| EXAMPLE 2-4 | 1.00 | Ba | 0.10 | 0.26 | 0.12 | 0.366 | 0.374 | NiO | 0.4 | — | 0 | 1050 |
| EXAMPLE 2-5 | 1.00 | Sr | 0.05 | 0.26 | 0.12 | 0.375 | 0.365 | NiO | 0.4 | — | 0 | 1010 |
| COMPARATIVE EXAMPLE 2-3 | 1.00 | Ba | 0.13 | 0.26 | 0.12 | 0.366 | 0.374 | NiO | 0.4 | — | 0 | 1050 |

TABLE 14

| | DENSITY ρs ($Mg/m^3$) | PIEZOELECTRIC STRAIN CONSTANT $d_{33}$ (pC/N) |
|---|---|---|
| EXAMPLE 2-3 | 7.86 | 570 |
| EXAMPLE 2-4 | 7.80 | 600 |
| EXAMPLE 2-5 | 7.83 | 600 |
| COMPARATIVE EXAMPLE 2-3 | 7.14 | unmeasurable |

TABLE 15

| | COMPOSITION | | | | | | | FIRST SUB-COMPONENT | | SECOND SUB-COMPONENT | | FIRING |
|---|---|---|---|---|---|---|---|---|---|---|---|---|
| | A (mol) | Me | B (mol) | a + b (mol) | b (mol) | c (mol) | d (mol) | KIND | CONTENT (mass %) | KIND | CONTENT (mass %) | TEMPERATURE (° C.) |
| EXAMPLE 2-6 | 1.00 | Sr | 0.05 | 0.26 | 0.05 | 0.377 | 0.363 | NiO | 0.4 | $Nb_2O_5$ | 0.5 | 1050 |
| EXAMPLE 2-7 | 1.00 | Sr | 0.05 | 0.40 | 0.25 | 0.302 | 0.298 | NiO | 0.4 | $Nb_2O_5$ | 0.5 | 1040 |
| COMPARATIVE EXAMPLE 2-4 | 1.00 | Sr | 0.05 | 0.26 | 0 | 0.379 | 0.361 | NiO | 0.4 | $Nb_2O_5$ | 0.5 | 1050 |
| COMPARATIVE EXAMPLE 2-5 | 1.00 | Sr | 0.05 | 0.40 | 0.30 | 0.302 | 0.298 | NiO | 0.4 | $Nb_2O_5$ | 0.5 | 1050 |

TABLE 16

| | DENSITY ρs ($Mg/m^3$) | PIEZOELECTRIC STRAIN CONSTANT $d_{33}$ (pC/N) |
|---|---|---|
| EXAMPLE 2-6 | 7.80 | 600 |
| EXAMPLE 2-7 | 7.81 | 630 |
| COMPARATIVE EXAMPLE 2-4 | 7.05 | unmeasurable |
| COMPARATIVE EXAMPLE 2-5 | 7.14 | unmeasurable |

TABLE 17

| | COMPOSITION | | | | | | | FIRST SUB-COMPONENT | | SECOND SUB-COMPONENT | | FIRING |
|---|---|---|---|---|---|---|---|---|---|---|---|---|
| | A (mol) | Me | B (mol) | a + b (mol) | b (mol) | c (mol) | d (mol) | KIND | CONTENT (mass %) | KIND | CONTENT (mass %) | TEMPERATURE (° C.) |
| EXAMPLE 2-8 | 1.00 | Ca | 0.04 | 0.26 | 0.12 | 0.374 | 0.366 | CoO | 0.05 | — | 0 | 1010 |
| EXAMPLE 2-9 | 1.00 | Sr | 0.05 | 0.26 | 0.12 | 0.372 | 0.368 | NiO | 0.8 | — | 0 | 1010 |
| EXAMPLE 2-10 | 1.00 | Ba | 0.07 | 0.26 | 0.12 | 0.375 | 0.365 | NiO | 0.4 | — | 0 | 1010 |
| EXAMPLE 2-11 | 1.00 | Sr | 0.05 | 0.26 | 0.12 | 0.375 | 0.365 | CuO | 0.1 | — | 0 | 1010 |
| EXAMPLE 2-12 | 1.00 | Sr | 0.05 | 0.26 | 0.12 | 0.375 | 0.365 | NiO $Fe_2O_3$ | 0.3 0.1 | — | 0 | 1010 |
| EXAMPLE 2-13 | 1.00 | Sr | 0.05 | 0.26 | 0.12 | 0.375 | 0.365 | CoO CuO | 0.1 0.1 | — | 0 | 1010 |
| COMPARATIVE EXAMPLE 2-6 | 1.00 | Sr | 0.05 | 0.26 | 0.12 | 0.378 | 0.362 | — | 0 | — | 0 | 1050 |
| COMPARATIVE EXAMPLE 2-7 | 1.00 | Sr | 0.05 | 0.26 | 0.12 | 0.372 | 0.368 | NiO | 1.2 | — | 0 | 1010 |

TABLE 18

| | DENSITY ρs ($Mg/m^3$) | PIEZOELECTRIC STRAIN CONSTANT $d_{33}$ (pC/N) |
|---|---|---|
| EXAMPLE 2-8 | 7.81 | 600 |
| EXAMPLE 2-9 | 7.86 | 610 |
| EXAMPLE 2-10 | 7.84 | 610 |
| EXAMPLE 2-11 | 7.85 | 600 |
| EXAMPLE 2-12 | 7.86 | 610 |
| EXAMPLE 2-13 | 7.87 | 600 |
| COMPARATIVE EXAMPLE 2-6 | 7.06 | unmeasurable |
| COMPARATIVE EXAMPLE 2-7 | 7.52 | 500 |

TABLE 19

| | A (mol) | Me | B (mol) | a + b (mol) | b (mol) | c (mol) | d (mol) | FIRST SUB-COMPONENT KIND | CONTENT (mass %) | SECOND SUB-COMPONENT KIND | CONTENT (mass %) | FIRING TEMPERATURE (° C.) |
|---|---|---|---|---|---|---|---|---|---|---|---|---|
| EXAMPLE 2-14 | 1.00 | Sr | 0.05 | 0.26 | 0.12 | 0.372 | 0.368 | CoO | 0.2 | $Sb_2O_3$ | 0.5 | 1040 |
| EXAMPLE 2-15 | 1.00 | Ba | 0.07 | 0.26 | 0.12 | 0.372 | 0.368 | $Fe_2O_3$ | 0.3 | $Nb_2O_5$ | 0.5 | 1040 |
| EXAMPLE 2-16 | 1.00 | Sr | 0.05 | 0.26 | 0.12 | 0.375 | 0.365 | NiO | 0.4 | $Ta_2O_5$ | 0.05 | 1010 |
| EXAMPLE 2-17 | 1.00 | Sr | 0.05 | 0.26 | 0.12 | 0.370 | 0.364 | $Fe_2O_3$ | 0.3 | $Sb_2O_3$ | 1.0 | 1050 |
| EXAMPLE 2-18 | 1.00 | Sr | 0.05 | 0.40 | 0.16 | 0.315 | 0.285 | NiO | 0.4 | $Ta_2O_5$ | 0.1 | 980 |
| EXAMPLE 2-19 | 1.00 | Sr | 0.04 | 0.26 | 0.12 | 0.373 | 0 367 | NiO | 0.3 | $Ta_2O_5$ | 0.2 | 1040 |
| | | Ba | 0.02 | | | | | $Fe_2O_3$ | 0.1 | $Nb_2O_5$ | 0.2 | |
| EXAMPLE 2-20 | 1.00 | Ca | 0.03 | 0.26 | 0.12 | 0.373 | 0.367 | NiO | 0.3 | $Sb_2O_3$ | 0.1 | 1040 |
| | | | | | | | | CoO | 0.05 | $Nb_2O_5$ | 0.1 | |
| | | | | | | | | CuO | 0.05 | $Ta_2O_5$ | 0.1 | |
| COMPARATIVE EXAMPLE 2-8 | 1.00 | Sr | 0.05 | 0.26 | 0.12 | 0.366 | 0.374 | $Fe_2O_3$ | 0.3 | $Sb_2O_3$ | 1.5 | 1050 |

TABLE 20

| | DENSITY ρs (Mg/m³) | PIEZOELECTRIC STRAIN CONSTANT $d_{33}$ (pC/N) |
|---|---|---|
| EXAMPLE 2-14 | 7.87 | 640 |
| EXAMPLE 2-15 | 7.89 | 640 |
| EXAMPLE 2-16 | 7.82 | 630 |
| EXAMPLE 2-17 | 7.80 | 610 |
| EXAMPLE 2-18 | 7.87 | 650 |
| EXAMPLE 2-19 | 7.86 | 650 |
| EXAMPLE 2-20 | 7.81 | 640 |
| COMPARATIVE EXAMPLE 2-8 | 7.00 | unmeasurable |

TABLE 21

| | A (mol) | Me | B (mol) | a + b (mol) | b (mol) | c (mol) | d (mol) | FIRST SUB-COMPONENT KIND | CONTENT (mass %) | SECOND SUB-COMPONENT KIND | CONTENT (mass %) | THIRD SUB-COMPONENT KIND | CONTENT (mass %) |
|---|---|---|---|---|---|---|---|---|---|---|---|---|---|
| EXAMPLE 2-21 | 1.00 | Sr | 0.05 | 0.26 | 0.12 | 0.375 | 0.365 | CoO | 0.1 | — | 0 | $K_2O$ | 0.05 |
| | | | | | | | | CuO | 0.1 | | | | |
| EXAMPLE 2-22 | 1.00 | Sr | 0.04 | 0.26 | 0.12 | 0.373 | 0.367 | NiO | 0.3 | $Ta_2O_5$ | 0.2 | $K_2O$ | 0.03 |
| | | Ba | 0.02 | | | | | $Fe_2O_3$ | 0.1 | $Nb_2O_5$ | 0.2 | $Na_2O$ | 0.02 |
| REFERENCE EXAMPLE 2-1 | 1.00 | Sr | 0.05 | 0.26 | 0.12 | 0.375 | 0.365 | CoO | 0.1 | — | 0 | — | 0 |
| | | | | | | | | CuO | 0.1 | | | | |
| REFERENCE EXAMPLE 2-2 | 1.00 | Sr | 0.04 | 0.26 | 0.12 | 0.373 | 0.367 | NiO | 0.3 | $Ta_2O_5$ | 0.2 | — | 0 |
| | | Ba | 0.02 | | | | | $Fe_2O_3$ | 0.1 | $Nb_2O_5$ | 0.2 | | |

Note:
The contents of the first sub-component, the second sub-component and the third sub-component are expressed in mass %.

TABLE 22

|  | FIRING TEMPERATURE (° C.) | DENSITY ρs (Mg/m³) | PIEZOELECTRIC STRAIN CONSTANT $d_{33}$ (pC/N) |
|---|---|---|---|
| EXAMPLE 2-21 | 950 | 7.85 | 600 |
| EXAMPLE 2-22 | 980 | 7.83 | 650 |
| REFERENCE EXAMPLE 2-1 | 950 | 7.13 | unmeasurable |
| REFERENCE EXAMPLE 2-2 | 980 | 7.14 | unmeasurable |

TABLE 23

| | COMPOSITION | | | | | SUB-COMPONENT | | FIRING TEMPERATURE (° C.) |
|---|---|---|---|---|---|---|---|---|
| | A/B | a (mol) | b (mol) | c (mol) | d (mol) | KIND | CONTENT (mass %) | |
| EXAMPLE 3-1 | 0.99 | 0.015 | 0.10 | 0.435 | 0.450 | $Nb_2O_5$ | 0.5 | 1050 |
| EXAMPLE 3-2 | 1.005 | 0.015 | 0.10 | 0.437 | 0.448 | $Nb_2O_5$ | 0.5 | 950 |
| COMPARATIVE EXAMPLE 3-1 | 0.98 | 0.015 | 0.10 | 0.435 | 0.450 | $Nb_2O_5$ | 0.5 | 1050 |
| COMPARATIVE EXAMPLE 3-2 | 1.01 | 0.015 | 0.10 | 0.437 | 0.448 | $Nb_2O_5$ | 0.5 | 950 |

TABLE 24

|  | DENSITY ρs (Mg/m³) | PIEZOELECTRIC STRAIN CONSTANT $d_{31}$ (pC/N) | MECHANICAL QUALITY FACTOR $Q_m$ | RATE OF CHANGE OF DISPLACEMENT |
|---|---|---|---|---|
| EXAMPLE 3-1 | 7.81 | 200 | 80 | ○ |
| EXAMPLE 3-2 | 7.89 | 210 | 80 | ○ |
| COMPARATIVE EXAMPLE 3-1 | 7.69 | 180 | 110 | x |
| COMPARATIVE EXAMPLE 3-2 | 7.65 | 175 | 120 | x |

TABLE 25

| | COMPOSITION | | | | | SUB-COMPONENT | | FIRING TEMPERATURE (° C.) |
|---|---|---|---|---|---|---|---|---|
| | A/B | a (mol) | b (mol) | c (mol) | d (mol) | KIND | CONTENT (mass %) | |
| EXAMPLE 3-3 | 1.00 | 0.005 | 0.10 | 0.437 | 0.458 | $Nb_2O_5$ | 0.5 | 1000 |
| EXAMPLE 3-4 | 1.00 | 0.030 | 0.10 | 0.434 | 0.436 | $Nb_2O_5$ | 0.5 | 1000 |
| COMPARATIVE EXAMPLE 3-3 | 1.00 | 0 | 0.10 | 0.437 | 0.463 | $Nb_2O_5$ | 0.5 | 1000 |
| COMPARATIVE EXAMPLE 3-4 | 1.00 | 0.040 | 0.10 | 0.434 | 0.426 | $Nb_2O_5$ | 0.5 | 1000 |

TABLE 26

|  | DENSITY ρs (Mg/m$^3$) | PIEZO-ELECTRIC STRAIN CONSTANT $d_{31}$ (pC/N) | MECHANICAL QUALITY FACTOR $Q_m$ | RATE OF CHANGE OF DISPLACEMENT |
| --- | --- | --- | --- | --- |
| EXAMPLE 3-3 | 7.91 | 220 | 80 | ○ |
| EXAMPLE 3-4 | 7.89 | 210 | 100 | ○ |
| COMPARATIVE EXAMPLE 3-3 | 7.85 | 220 | 70 | x |
| COMPARATIVE EXAMPLE 3-4 | 7.70 | 180 | 190 | ○ |

TABLE 27

|  | COMPOSITION | | | | | SUB-COMPONENT | | FIRING TEMPERATURE (° C.) |
| --- | --- | --- | --- | --- | --- | --- | --- | --- |
|  | A/B | a (mol) | b (mol) | c (mol) | d (mol) | KIND | CONTENT (mass %) |  |
| EXAMPLE 3-5 | 1.00 | 0.010 | 0.05 | 0.480 | 0.460 | Nb$_2$O$_5$ | 0.5 | 1050 |
| EXAMPLE 3-6 | 1.00 | 0.015 | 0.20 | 0.370 | 0.415 | Nb$_2$O$_5$ | 0.5 | 950 |
| COMPARATIVE EXAMPLE 3-5 | 1.00 | 0.010 | 0.03 | 0.490 | 0.470 | Nb$_2$O$_5$ | 0.5 | 1050 |
| COMPARATIVE EXAMPLE 3-6 | 1.00 | 0.015 | 0.23 | 0.360 | 0.395 | Nb$_2$O$_5$ | 0.5 | 950 |

TABLE 28

|  | DENSITY ρs (Mg/m$^3$) | PIEZO-ELECTRIC STRAIN CONSTANT $d_{31}$ (pC/N) | MECHANICAL QUALITY FACTOR $Q_m$ | RATE OF CHANGE OF DISPLACEMENT |
| --- | --- | --- | --- | --- |
| EXAMPLE 3-5 | 7.86 | 205 | 70 | ○ |
| EXAMPLE 3-6 | 7.88 | 240 | 80 | ○ |
| COMPARATIVE EXAMPLE 3-5 | 7.71 | 180 | 70 | x |
| COMPARATIVE EXAMPLE 3-6 | 7.68 | 185 | 80 | x |

TABLE 29

|  | COMPOSITION | | | | | SUB-COMPONENT | | FIRING TEMPERATURE (° C.) |
| --- | --- | --- | --- | --- | --- | --- | --- | --- |
|  | A/B | a (mol) | b (mol) | c (mol) | d (mol) | KIND | CONTENT (mass %) |  |
| EXAMPLE 3-7 | 1.00 | 0.030 | 0.20 | 0.360 | 0.410 | Sb$_2$O$_3$ | 0.5 | 950 |
| EXAMPLE 3-8 | 1.00 | 0.005 | 0.05 | 0.490 | 0.455 | Sb$_2$O$_3$ | 0.5 | 1050 |
| COMPARATIVE EXAMPLE 3-7 | 1.00 | 0.030 | 0.20 | 0.350 | 0.420 | Sb$_2$O$_3$ | 0.5 | 950 |
| COMPARATIVE EXAMPLE 3-8 | 1.00 | 0.005 | 0.05 | 0.500 | 0.445 | Sb$_2$O$_3$ | 0.5 | 1050 |

TABLE 30

| | DENSITY ρs (Mg/m³) | PIEZO-ELECTRIC STRAIN CONSTANT $d_{31}$ (pC/N) | MECHANICAL QUALITY FACTOR $Q_m$ | RATE OF CHANGE OF DISPLACEMENT |
|---|---|---|---|---|
| EXAMPLE 3-7 | 7.84 | 205 | 90 | ○ |
| EXAMPLE 3-8 | 7.87 | 200 | 90 | ○ |
| COMPARATIVE EXAMPLE 3-7 | 7.77 | 180 | 110 | x |
| COMPARATIVE EXAMPLE 3-8 | 7.80 | 175 | 120 | x |

TABLE 31

| | COMPOSITION | | | | | | FIRING TEMPERATURE (° C.) |
|---|---|---|---|---|---|---|---|
| | | | | | | SUB-COMPONENT | |
| | A/B | a (mol) | b (mol) | c (mol) | d (mol) | KIND | CONTENT (mass %) | |
| EXAMPLE 3-9 | 1.00 | 0.005 | 0.20 | 0.405 | 0.390 | $Sb_2O_3$ | 0.1 | 950 |
| EXAMPLE 3-10 | 1.00 | 0.030 | 0.05 | 0.440 | 0.480 | $Ta_2O_5$ | 1.0 | 1050 |
| COMPARATIVE EXAMPLE 3-9 | 1.00 | 0.005 | 0.20 | 0.415 | 0.380 | $Sb_2O_3$ | 0.1 | 950 |
| COMPARATIVE EXAMPLE 3-10 | 1.00 | 0.030 | 0.05 | 0.430 | 0.490 | $Ta_2O_5$ | 1.0 | 1050 |

TABLE 32

| | DENSITY ρs (Mg/m³) | PIEZO-ELECTRIC STRAIN CONSTANT $d_{31}$ (pC/N) | MECHANICAL QUALITY FACTOR $Q_m$ | RATE OF CHANGE OF DISPLACEMENT |
|---|---|---|---|---|
| EXAMPLE 3-9 | 7.82 | 205 | 100 | ○ |
| EXAMPLE 3-10 | 7.81 | 200 | 100 | ○ |
| COMPARATIVE EXAMPLE 3-9 | 7.70 | 180 | 120 | x |
| COMPARATIVE EXAMPLE 3-10 | 7.78 | 170 | 120 | x |

TABLE 33

| | COMPOSITION | | | | | | | FIRING TEMPERATURE (° C.) |
|---|---|---|---|---|---|---|---|---|
| | | | | | | SUB-COMPONENT | | |
| | A/B | a (mol) | b (mol) | c (mol) | d (mol) | KIND | CONTENT (mass %) | |
| EXAMPLE 3-11 | 1.00 | 0.015 | 0.10 | 0.435 | 0.450 | $Sb_2O_3$ $Nb_2O_5$ | 0.3 0.3 | 1000 |
| EXAMPLE 3-12 | 1.00 | 0.015 | 0.10 | 0.435 | 0.450 | $Ta_2O_5$ $Nb_2O_5$ | 0.3 0.3 | 1000 |
| EXAMPLE 3-13 | 1.00 | 0.015 | 0.10 | 0.435 | 0.450 | $Sb_2O_3$ $Ta_2O_5$ | 0.3 0.3 | 1000 |

TABLE 33-continued

| | | | | | | SUB-COMPONENT | | FIRING |
|---|---|---|---|---|---|---|---|---|
| | A/B | a (mol) | b (mol) | c (mol) | d (mol) | KIND | CONTENT (mass %) | TEMPERATURE (° C.) |
| EXAMPLE 3-14 | 1.00 | 0.015 | 0.10 | 0.435 | 0.450 | $Sb_2O_3$ | 0.2 | 1000 |
| | | | | | | $Nb_2O_5$ | 0.2 | |
| | | | | | | $Ta_2O_5$ | 0.2 | |
| EXAMPLE 3-15 | 1.00 | 0.015 | 0.10 | 0.438 | 0.447 | $Ta_2O_5$ | 0.1 | 980 |
| EXAMPLE 3-16 | 1.00 | 0.015 | 0.10 | 0.420 | 0.465 | $Sb_2O_3$ | 1.0 | 1050 |
| COMPARATIVE EXAMPLE 3-11 | 1.00 | 0.015 | 0.10 | 0.438 | 0.447 | — | 0 | 980 |
| COMPARATIVE EXAMPLE 3-12 | 1.00 | 0.015 | 0.10 | 0.420 | 0.465 | $Sb_2O_3$ | 1.5 | 1050 |

TABLE 34

| | DENSITY ρs (Mg/m$^3$) | PIEZOELECTRIC STRAIN CONSTANT $d_{31}$ (pC/N) | MECHANICAL QUALITY FACTOR $Q_m$ | RATE OF CHANGE OF DISPLACEMENT |
|---|---|---|---|---|
| EXAMPLE 3-11 | 7.91 | 210 | 80 | ○ |
| EXAMPLE 3-12 | 7.90 | 210 | 80 | ○ |
| EXAMPLE 3-13 | 7.92 | 220 | 80 | ○ |
| EXAMPLE 3-14 | 7.89 | 220 | 80 | ○ |
| EXAMPLE 3-15 | 7.83 | 200 | 80 | ○ |
| EXAMPLE 3-16 | 7.85 | 205 | 80 | ○ |
| COMPARATIVE EXAMPLE 3-11 | 7.77 | 185 | 90 | x |
| COMPARATIVE EXAMPLE 3-12 | 7.61 | 165 | 140 | x |

TABLE 35

| | COMPOSITION | | | | FIRST SUB-COMPONENT | | SECOND SUB-COMPONENT | | FIRING |
|---|---|---|---|---|---|---|---|---|---|
| | A (mol) | a (mol) | b (mol) | c (mol) | KIND | CONTENT (mass %) | KIND | CONTENT (mass %) | TEMPERATURE (° C.) |
| EXAMPLE 4-1 | 0.99 | 0.1 | 0.432 | 0.468 | NiO | 0.4 | $Sb_2O_3$ | 0.3 | 1050 |
| EXAMPLE 4-2 | 1.005 | 0.1 | 0.432 | 0.468 | NiO | 0.4 | $Sb_2O_3$ | 0.3 | 950 |
| COMPARATIVE EXAMPLE 4-1 | 0.98 | 0.1 | 0.432 | 0.468 | NiO | 0.4 | $Sb_2O_3$ | 0.3 | 1050 |
| COMPARATIVE EXAMPLE 4-2 | 1.01 | 0.1 | 0.432 | 0.468 | NiO | 0.4 | $Sb_2O_3$ | 0.3 | 950 |

TABLE 36

| | DENSITY ρs (Mg/m$^3$) | PIEZOELECTRIC STRAIN CONSTANT $d_{31}$ (pC/N) | EVALUATION RESULT OF FLEXURAL STRENGTH |
|---|---|---|---|
| EXAMPLE 4-1 | 7.83 | 200 | ○ |
| EXAMPLE 4-2 | 7.88 | 205 | ○ |
| COMPARATIVE EXAMPLE 4-1 | 7.05 | unmeasurable | x |
| COMPARATIVE EXAMPLE 4-2 | 7.42 | 155 | x |

TABLE 37

| | COMPOSITION | | | | | | | | FIRING TEMPERATURE (° C.) |
|---|---|---|---|---|---|---|---|---|---|
| | | | | | FIRST SUB-COMPONENT | | SECOND SUB-COMPONENT | | |
| | A (mol) | a (mol) | b (mol) | c (mol) | KIND | CONTENT (mass %) | KIND | CONTENT (mass %) | |
| EXAMPLE 4-3 | 0.998 | 0.05 | 0.48 | 0.47 | $Fe_2O_3$ | 0.3 | $Nb_2O_5$ | 0.5 | 1050 |
| EXAMPLE 4-4 | 1.005 | 0.25 | 0.35 | 0.4 | $Fe_2O_3$ | 0.3 | $Nb_2O_5$ | 0.5 | 1000 |
| COMPARATIVE EXAMPLE 4-3 | 0.998 | 0.01 | 0.49 | 0.5 | $Fe_2O_3$ | 0.3 | $Nb_2O_5$ | 0.5 | 1050 |
| COMPARATIVE EXAMPLE 4-4 | 1.005 | 0.28 | 0.35 | 0.37 | $Fe_2O_3$ | 0.3 | $Nb_2O_5$ | 0.5 | 1000 |

TABLE 38

| | DENSITY $\rho s$ ($Mg/m^3$) | PIEZOELECTRIC STRAIN CONSTANT $d_{31}$ (pC/N) | EVALUATION RESULT OF FLEXURAL STRENGTH |
|---|---|---|---|
| EXAMPLE 4-3 | 7.89 | 200 | ○ |
| EXAMPLE 4-4 | 7.80 | 200 | ○ |
| COMPARATIVE EXAMPLE 4-3 | 7.59 | 160 | x |
| COMPARATIVE EXAMPLE 4-4 | 7.47 | 150 | ○ |

TABLE 39

| | COMPOSITION | | | | | | | | FIRING TEMPERATURE (° C.) |
|---|---|---|---|---|---|---|---|---|---|
| | | | | | FIRST SUB-COMPONENT | | SECOND SUB-COMPONENT | | |
| | A (mol) | a (mol) | b (mol) | c (mol) | KIND | CONTENT (mass %) | KIND | CONTENT (mass %) | |
| EXAMPLE 4-5 | 1.005 | 0.25 | 0.35 | 0.4 | $Fe_2O_3$ | 0.3 | $Nb_2O_5$ | 0.5 | 1000 |
| EXAMPLE 4-6 | 0.99 | 0.05 | 0.5 | 0.45 | CoO | 0.2 | $Ta_2O_5$ | 0.1 | 1050 |
| COMPARATIVE EXAMPLE 4-5 | 1.005 | 0.25 | 0.34 | 0.41 | $Fe_2O_3$ | 0.3 | $Nb_2O_5$ | 0.5 | 1000 |
| COMPARATIVE EXAMPLE 4-6 | 0.99 | 0.05 | 0.51 | 0.44 | CoO | 0.2 | $Ta_2O_5$ | 0.1 | 1050 |

TABLE 40

| | DENSITY $\rho s$ ($Mg/m^3$) | PIEZOELECTRIC STRAIN CONSTANT $d_{31}$ (pC/N) | EVALUATION RESULT OF FLEXURAL STRENGTH |
|---|---|---|---|
| EXAMPLE 4-5 | 7.80 | 200 | ○ |
| EXAMPLE 4-6 | 7.86 | 205 | ○ |
| COMPARATIVE EXAMPLE 4-5 | 7.80 | 185 | ○ |
| COMPARATIVE EXAMPLE 4-6 | 7.84 | 180 | ○ |

TABLE 41

| | COMPOSITION | | | | | | | FIRING TEMPERATURE (° C.) |
|---|---|---|---|---|---|---|---|---|
| | A (mol) | a (mol) | b (mol) | c (mol) | FIRST SUB-COMPONENT | | SECOND SUB-COMPONENT | |
| | | | | | KIND | CONTENT (mass %) | KIND | CONTENT (mass %) | |
| EXAMPLE 4-7 | 1.005 | 0.25 | 0.37 | 0.38 | NiO | 0.4 | $Ta_2O_5$ | 1.0 | 1050 |
| EXAMPLE 4-8 | 0.992 | 0.05 | 0.47 | 0.48 | CuO | 0.01 | $Sb_2O_3$ | 0.1 | 1030 |
| COMPARATIVE EXAMPLE 4-7 | 1.005 | 0.25 | 0.38 | 0.37 | NiO | 0.4 | $Ta_2O_5$ | 1.0 | 1050 |
| COMPARATIVE EXAMPLE 4-8 | 0.992 | 0.05 | 0.46 | 0.49 | CuO | 0.01 | $Sb_2O_3$ | 0.1 | 1030 |

TABLE 42

| | DENSITY ρs ($Mg/m^3$) | PIEZO-ELECTRIC STRAIN CONSTANT $d_{31}$ (pC/N) | EVALUATION RESULT OF FLEXURAL STRENGTH |
|---|---|---|---|
| EXAMPLE 4-7 | 7.88 | 200 | ○ |
| EXAMPLE 4-8 | 7.87 | 200 | ○ |
| COMPARATIVE EXAMPLE 4-7 | 7.85 | 180 | ○ |
| COMPARATIVE EXAMPLE 4-8 | 7.84 | 175 | ○ |

TABLE 43

| | COMPOSITION | | | | | | | | FIRING TEMPERATURE (° C.) |
|---|---|---|---|---|---|---|---|---|---|
| | A (mol) | a (mol) | b (mol) | c (mol) | FIRST SUB-COMPONENT | | SECOND SUB-COMPONENT | | |
| | | | | | KIND | CONTENT (mass %) | KIND | CONTENT (mass %) | |
| EXAMPLE 4-9 | 0.992 | 0.05 | 0.47 | 0.48 | CuO | 0.01 | $Sb_2O_3$ | 0.1 | 1030 |
| EXAMPLE 4-10 | 1 | 0.12 | 0.42 | 0.46 | NiO | 0.8 | $Nb_2O_5$ | 0.2 | 950 |
| COMPARATIVE EXAMPLE 4-9 | 0.992 | 0.05 | 0.47 | 0.48 | — | — | $Sb_2O_3$ | 0.1 | 1050 |
| COMPARATIVE EXAMPLE 4-10 | 1 | 0.12 | 0.42 | 0.46 | NiO | 1.0 | $Nb_2O_5$ | 0.2 | 950 |

TABLE 44

| | DENSITY ρs ($Mg/m^3$) | PIEZO-ELECTRIC STRAIN CONSTANT $d_{31}$ (pC/N) | EVALUATION RESULT OF FLEXURAL STRENGTH |
|---|---|---|---|
| EXAMPLE 4-9 | 7.87 | 200 | ○ |
| EXAMPLE 4-10 | 7.80 | 200 | ○ |
| COMPARATIVE EXAMPLE 4-9 | 7.51 | 170 | x |
| COMPARATIVE EXAMPLE 4-10 | 7.40 | 150 | x |

TABLE 45

| | COMPOSITION | | | | | | | FIRING |
|---|---|---|---|---|---|---|---|---|
| | | | | | FIRST SUB-COMPONENT | | SECOND SUB-COMPONENT | |
| | A (mol) | a (mol) | b (mol) | c (mol) | KIND | CONTENT (mass %) | KIND | CONTENT (mass %) | TEMPERATURE (° C.) |
| EXAMPLE 4-11 | 0.99 | 0.05 | 0.5 | 0.45 | CoO | 0.2 | $Ta_2O_5$ | 0.1 | 1050 |
| EXAMPLE 4-12 | 1.005 | 0.25 | 0.37 | 0.38 | NiO | 0.4 | $Ta_2O_5$ | 1.0 | 1050 |
| COMPARATIVE EXAMPLE 4-11 | 0.99 | 0.05 | 0.5 | 0.45 | CoO | 0.2 | — | — | 1050 |
| COMPARATIVE EXAMPLE 4-12 | 1.005 | 0.25 | 0.37 | 0.38 | NiO | 0.4 | $Ta_2O_5$ | 1.3 | 1050 |

TABLE 46

| | DENSITY ρs ($Mg/m^3$) | PIEZO-ELECTRIC STRAIN CONSTANT $d_{31}$ (pC/N) | EVALUATION RESULT OF FLEXURAL STRENGTH |
|---|---|---|---|
| EXAMPLE 4-11 | 7.86 | 205 | ○ |
| EXAMPLE 4-12 | 7.88 | 200 | ○ |
| COMPARATIVE EXAMPLE 4-11 | 7.81 | 190 | x |
| COMPARATIVE EXAMPLE 4-12 | 7.56 | 160 | x |

TABLE 47

| | COMPOSITION | | | | | | | | FIRING |
|---|---|---|---|---|---|---|---|---|---|
| | | | | | FIRST SUB-COMPONENT | | SECOND SUB-COMPONENT | | |
| | A (mol) | a (mol) | b (mol) | c (mol) | KIND | CONTENT (mass %) | KIND | CONTENT (mass %) | TEMPERATURE (° C.) |
| EXAMPLE 4-13 | 0.999 | 0.11 | 0.425 | 0.465 | $Fe_2O_3$ | 0.2 | $Sb_2O_3$ | 0.2 | 950 |
| EXAMPLE 4-14 | 0.996 | 0.12 | 0.422 | 0.458 | $Fe_2O_3$ NiO | 0.1 0.2 | $Nb_2O_5$ | 0.5 | 1000 |
| EXAMPLE 4-15 | 0.996 | 0.12 | 0.422 | 0.458 | NiO | 0.4 | $Sb_2O_3$ $Nb_2O_5$ $Ta_2O_5$ | 0.1 0.1 0.1 | 1000 |
| EXAMPLE 4-16 | 1 | 0.12 | 0.422 | 0.458 | CuO CoO $Fe_2O_3$ | 0.05 0.1 0.15 | $Sb_2O_3$ $Nb_2O_5$ $Ta_2O_5$ | 0.1 0.2 0.1 | 980 |

TABLE 48

| | DENSITY ρs ($Mg/m^3$) | PIEZO-ELECTRIC STRAIN CONSTANT $d_{31}$ (pC/N) | EVALUATION RESULT OF FLEXURAL STRENGTH |
|---|---|---|---|
| EXAMPLE 4-13 | 7.91 | 210 | ○ |
| EXAMPLE 4-14 | 7.95 | 210 | ○ |
| EXAMPLE 4-15 | 7.99 | 205 | ○ |
| EXAMPLE 4-16 | 7.92 | 205 | ○ |

TABLE 49

| | COMPOSITION | | | | | | | | | FIRING |
|---|---|---|---|---|---|---|---|---|---|---|
| | | | | | | | FIRST SUB-COMPONENT | | SECOND SUB-COMPONENT | |
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-1 | 0.99 | Sr | 0.05 | 0.1 | 0.433 | 0.467 | CoO | 0.2 | $Sb_2O_3$ | 0.3 | 1050 |
| EXAMPLE 5-2 | 1.005 | Ba | 0.05 | 0.1 | 0.433 | 0.467 | CuO | 0.2 | $Sb_2O_3$ | 0.3 | 950 |
| COMPARATIVE EXAMPLE 5-1 | 0.98 | Sr | 0.05 | 0.1 | 0.433 | 0.467 | CoO | 0.2 | $Sb_2O_3$ | 0.3 | 1050 |
| COMPARATIVE EXAMPLE 5-2 | 1.01 | Ba | 0.05 | 0.1 | 0.433 | 0.467 | CuO | 0.2 | $Sb_2O_3$ | 0.3 | 950 |

TABLE 50

| | DENSITY ρs ($Mg/m^3$) | PIEZO-ELECTRIC STRAIN CONSTANT $d_{31}$ (pC/N) | EVALUATION RESULT OF FLEXURAL STRENGTH |
|---|---|---|---|
| EXAMPLE 5-1 | 7.80 | 210 | ○ |
| EXAMPLE 5-2 | 7.85 | 220 | ○ |
| COMPARATIVE EXAMPLE 5-1 | 6.98 | unmeasurable | x |
| COMPARATIVE EXAMPLE 5-2 | 7.40 | 160 | x |

TABLE 51

| | COMPOSITION | | | | | | | | | | FIRING |
|---|---|---|---|---|---|---|---|---|---|---|---|
| | | | | | | | FIRST SUB-COMPONENT | | SECOND SUB-COMPONENT | | |
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-3 | 0.998 | Ca | 0.005 | 0.05 | 0.48 | 0.47 | $Fe_2O_3$ | 0.3 | $Nb_2O_5$ | 0.5 | 1050 |
| EXAMPLE 5-4 | 1 | Ba | 0.1 | 0.12 | 0.445 | 0.435 | CoO | 0.25 | $Nb_2O_5$ | 0.5 | 1050 |
| COMPARATIVE EXAMPLE 5-3 | 1 | Ba | 0.13 | 0.12 | 0.445 | 0.435 | CoO | 0.25 | $Nb_2O_5$ | 0.5 | 1050 |

TABLE 52

| | DENSITY ρs ($Mg/m^3$) | PIEZO-ELECTRIC STRAIN CONSTANT $d_{31}$ (pC/N) | EVALUATION RESULT OF FLEXURAL STRENGTH |
|---|---|---|---|
| EXAMPLE 5-3 | 7.89 | 215 | ○ |
| EXAMPLE 5-4 | 7.80 | 250 | ○ |
| COMPARATIVE EXAMPLE 5-3 | 7.50 | 180 | x |

TABLE 53

| | COMPOSITION | | | | | | FIRST SUB-COMPONENT | | SECOND SUB-COMPONENT | | FIRING |
|---|---|---|---|---|---|---|---|---|---|---|---|
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-5 | 0.998 | Ca | 0.005 | 0.05 | 0.48 | 0.47 | $Fe_2O_3$ | 0.3 | $Nb_2O_5$ | 0.5 | 1050 |
| EXAMPLE 5-6 | 1.005 | Sr | 0.04 | 0.25 | 0.35 | 0.4 | NiO | 0.4 | $Nb_2O_5$ | 0.5 | 1000 |
| COMPARATIVE EXAMPLE 5-4 | 0.998 | Ca | 0.005 | 0.01 | 0.49 | 0.5 | $Fe_2O_3$ | 0.3 | $Nb_2O_5$ | 0.5 | 1050 |
| COMPARATIVE EXAMPLE 5-5 | 1.005 | Sr | 0.04 | 0.28 | 0.35 | 0.37 | NiO | 0.4 | $Nb_2O_5$ | 0.5 | 1000 |

TABLE 54

| | DENSITY ρs (Mg/m³) | PIEZO-ELECTRIC STRAIN CONSTANT $d_{31}$ (pC/N) | EVALUATION RESULT OF FLEXURAL STRENGTH |
|---|---|---|---|
| EXAMPLE 5-5 | 7.89 | 215 | ○ |
| EXAMPLE 5-6 | 7.81 | 220 | ○ |
| COMPARATIVE EXAMPLE 5-4 | 7.48 | 165 | x |
| COMPARATIVE EXAMPLE 5-5 | 7.44 | 160 | ○ |

TABLE 55

| | COMPOSITION | | | | | | FIRST SUB-COMPONENT | | SECOND SUB-COMPONENT | | FIRING |
|---|---|---|---|---|---|---|---|---|---|---|---|
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-7 | 1.005 | Sr | 0.04 | 0.25 | 0.35 | 0.4 | NiO | 0.4 | $Nb_2O_5$ | 0.5 | 1000 |
| EXAMPLE 5-8 | 0.99 | Ba | 0.01 | 0.05 | 0.5 | 0.45 | NiO | 0.2 | $Ta_2O_5$ | 0.1 | 1050 |
| COMPARATIVE EXAMPLE 5-6 | 1.005 | Sr | 0.04 | 0.25 | 0.34 | 0.41 | NiO | 0.4 | $Nb_2O_5$ | 0.5 | 1000 |
| COMPARATIVE EXAMPLE 5-7 | 0.99 | Ba | 0.01 | 0.05 | 0.51 | 0.44 | NiO | 0.2 | $Ta_2O_5$ | 0.1 | 1050 |

TABLE 56

| | DENSITY ρs (Mg/m³) | PIEZO-ELECTRIC STRAIN CONSTANT $d_{31}$ (pC/N) | EVALUATION RESULT OF FLEXURAL STRENGTH |
|---|---|---|---|
| EXAMPLE 5-7 | 7.81 | 220 | ○ |
| EXAMPLE 5-8 | 7.86 | 205 | ○ |
| COMPARATIVE EXAMPLE 5-6 | 7.80 | 185 | ○ |
| COMPARATIVE EXAMPLE 5-7 | 7.84 | 180 | ○ |

TABLE 57

| | COMPOSITION | | | | | | FIRST SUB-COMPONENT | | SECOND SUB-COMPONENT | | FIRING |
|---|---|---|---|---|---|---|---|---|---|---|---|
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-9 | 1.005 | Ba | 0.02 | 0.25 | 0.37 | 0.38 | $Fe_2O_3$ | 0.3 | $Ta_2O_5$ | 1.0 | 1050 |
| EXAMPLE 5-10 | 0.992 | Sr | 0.05 | 0.05 | 0.47 | 0.48 | CuO | 0.01 | $Sb_2O_3$ | 0.1 | 1050 |
| COMPARATIVE EXAMPLE 5-8 | 1.005 | Ba | 0.02 | 0.25 | 0.38 | 0.37 | $Fe_2O_3$ | 0.3 | $Ta_2O_5$ | 1.0 | 1050 |
| COMPARATIVE EXAMPLE 5-9 | 0.992 | Sr | 0.05 | 0.05 | 0.46 | 0.49 | CuO | 0.01 | $Sb_2O_3$ | 0.1 | 1050 |

TABLE 58

| | DENSITY ρs (Mg/m³) | PIEZOELECTRIC STRAIN CONSTANT $d_{31}$ (pC/N) | EVALUATION RESULT OF FLEXURAL STRENGTH |
|---|---|---|---|
| EXAMPLE 5-9 | 7.88 | 205 | ○ |
| EXAMPLE 5-10 | 7.88 | 210 | ○ |
| COMPARATIVE EXAMPLE 5-8 | 7.84 | 180 | ○ |
| COMPARATIVE EXAMPLE 5-9 | 7.84 | 185 | ○ |

TABLE 59

| | COMPOSITION | | | | | | FIRST SUB-COMPONENT | | SECOND SUB-COMPONENT | | FIRING |
|---|---|---|---|---|---|---|---|---|---|---|---|
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-11 | 0.992 | Sr | 0.05 | 0.05 | 0.47 | 0.48 | CuO | 0.01 | $Sb_2O_3$ | 0.1 | 1050 |
| EXAMPLE 5-12 | 0.999 | Sr | 0.05 | 0.12 | 0.425 | 0.455 | NiO | 0.8 | $Nb_2O_5$ | 0.2 | 950 |
| COMPARATIVE EXAMPLE 5-10 | 0.992 | Sr | 0.05 | 0.05 | 0.47 | 0.48 | — | — | $Sb_2O_3$ | 0.1 | 1050 |
| COMPARATIVE EXAMPLE 5-11 | 0.999 | Sr | 0.05 | 0.12 | 0.425 | 0.455 | NiO | 1.0 | $Nb_2O_5$ | 0.2 | 950 |

TABLE 60

| | DENSITY ρs (Mg/m³) | PIEZOELECTRIC STRAIN CONSTANT $d_{31}$ (pC/N) | EVALUATION RESULT OF FLEXURAL STRENGTH |
|---|---|---|---|
| EXAMPLE 5-11 | 7.88 | 210 | ○ |
| EXAMPLE 5-12 | 7.81 | 215 | ○ |
| COMPARATIVE EXAMPLE 5-10 | 7.43 | 170 | x |
| COMPARATIVE EXAMPLE 5-11 | 7.39 | 155 | x |

TABLE 61

| | COMPOSITION | | | | | | | | | |
|---|---|---|---|---|---|---|---|---|---|---|
| | | | | | | | FIRST SUB-COMPONENT | | SECOND SUB-COMPONENT | FIRING |
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-13 | 0.99 | Ba | 0.01 | 0.05 | 0.5 | 0.45 | NiO | 0.2 | $Ta_2O_5$ | 0.1 | 1050 |
| EXAMPLE 5-14 | 1.005 | Ba | 0.02 | 0.25 | 0.37 | 0.38 | $Fe_2O_3$ | 0.3 | $Ta_2O_5$ | 1.0 | 1050 |
| COMPARATIVE EXAMPLE 5-12 | 0.99 | Ba | 0.01 | 0.05 | 0.5 | 0.45 | NiO | 0.2 | — | — | 1050 |
| COMPARATIVE EXAMPLE 5-13 | 1.005 | Ba | 0.02 | 0.25 | 0.37 | 0.38 | $Fe_2O_3$ | 0.3 | $Ta_2O_5$ | 1.3 | 1050 |

TABLE 62

| | DENSITY ρs ($Mg/m^3$) | PIEZOELECTRIC STRAIN CONSTANT $d_{31}$ (pC/N) | EVALUATION RESULT OF FLEXURAL STRENGTH |
|---|---|---|---|
| EXAMPLE 5-13 | 7.86 | 205 | ○ |
| EXAMPLE 5-14 | 7.88 | 205 | ○ |
| COMPARATIVE EXAMPLE 5-12 | 7.78 | 190 | x |
| COMPARATIVE EXAMPLE 5-13 | 7.55 | 165 | x |

TABLE 63

| | COMPOSITION | | | | | | | | | |
|---|---|---|---|---|---|---|---|---|---|---|
| | | | | | | | FIRST SUB-COMPONENT | | SECOND SUB-COMPONENT | FIRING |
| | A (mol) | Me | B (mol) | a (mol) | b (mol) | c (mol) | KIND | CONTENT (mass %) | KIND | CONTENT (mass %) | TEMPERATURE (° C.) |
| EXAMPLE 5-15 | 0.999 | Ca | 0.05 | 0.11 | 0.435 | 0.455 | $Fe_2O_3$ | 0.2 | $Ta_2O_5$ | 0.2 | 950 |
| EXAMPLE 5-16 | 0.999 | Ca Ba | 0.01 0.03 | 0.125 | 0.44 | 0.435 | NiO | 0.2 | $Nb_2O_5$ | 0.5 | 1000 |
| EXAMPLE 5-17 | 0.997 | Sr | 0.05 | 0.125 | 0.44 | 0.435 | $Fe_2O_3$ NiO | 0.1 0.2 | $Sb_2O_3$ | 0.3 | 980 |
| EXAMPLE 5-18 | 0.997 | Ba Sr | 0.03 0.02 | 0.125 | 0.44 | 0.435 | $Fe_2O_3$ | 0.3 | $Sb_2O_3$ $Nb_2O_5$ $Ta_2O_5$ | 0.1 0.1 0.1 | 980 |
| EXAMPLE 5-19 | 1.001 | Ca | 0.03 | 0.125 | 0.44 | 0.435 | CuO NiO $Fe_2O_3$ | 0.1 0.2 0.1 | $Sb_2O_3$ $Nb_2O_5$ $Ta_2O_5$ | 0.1 0.1 0.1 | 1000 |

TABLE 64

| | DENSITY ρs ($Mg/m^3$) | PIEZOELECTRIC STRAIN CONSTANT $d_{31}$ (pC/N) | EVALUATION RESULT OF FLEXURAL STRENGTH |
|---|---|---|---|
| EXAMPLE 5-15 | 7.91 | 225 | ○ |
| EXAMPLE 5-16 | 7.95 | 230 | ○ |
| EXAMPLE 5-17 | 7.95 | 240 | ○ |
| EXAMPLE 5-18 | 7.99 | 235 | ○ |
| EXAMPLE 5-19 | 7.92 | 235 | ○ |

What is claimed is:

1. A piezoelectric ceramic, comprising:
an oxide represented by Chemical Formula 1:
$Pb_A[(Mg_{1/3}Nb_{2/3})_a(Zn_{1/3}Nb_{2/3})_bTi_cZr_d]O_3$ as a main component, wherein
the values of A, a, b, c and d satisfy each of a+b+c+d=1, $0.99 \leq A \leq 1.01$, $0.15 \leq a+b \leq 0.5$, $0.05 \leq b \leq 0.25$, $0.2 \leq c \leq 0.5$, and $0.15 \leq d \leq 0.6$; and
0.01 mass % to 0.8 mass % inclusive of at least one kind selected from the group consisting of iron (Fe) and nickel (Ni) in the form of oxide ($Fe_2O_3$, NiO) per 1 mol of the main component as a first sub-component.

2. A piezoelectric ceramic, comprising:

an oxide represented by Chemical Formula 1:

$Pb_A[(Mg_{1/3}Nb_{2/3})_a(Zn_{1/3}Nb_{2/3})_bTi_cZr_d]O_3$ as a main component, wherein the values of A, a, b, c and d satisfy each of a+b+c+d=1, $0.99 \leq A \leq 1.01$, $0.15 \leq a+b \leq 0.5$, $0.05 \leq b \leq 0.25$, $0.2 \leq c \leq 0.5$, and $0.15 \leq d \leq 0.6$; and 0.01 mass % to 0.8 mass % inclusive of at least one kind selected from the group consisting of iron (Fe), cobalt (Co), nickel (Ni) and copper (Cu) in the form of oxide ($Fe_2O_3$, CoO, NiO, CuO) per 1 mol of the main component as a first sub-component, and further comprising:

0.05 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component as a second sub-component.

3. A piezoelectric ceramic according to claim 2, further comprising:

0.01 mass % to 0.1 mass % inclusive of at least one kind selected from the group consisting of sodium (Na) and potassium (K) in the form of oxide ($Na_2O$, $K_2O$) per 1 mol of the main component as a third sub-component.

4. A piezoelectric ceramic ceramic, comprising:

an oxide represented by Chemical Formula 1:

$Pb_A[(Mg_{1/3}Nb_{2/3})_a(Zn_{1/3}Nb_{2/3})_bTi_cZr_d]O_3$ as a main component, wherein the values of A, a, b, c and d satisfy each of a+b+c+d=1, $0.99 \leq A \leq 1.01$, $0.15 \leq a+b \leq 0.5$, $0.05 \leq b \leq 0.25$, $0.2 \leq c \leq 0.5$, and $0.15 \leq d \leq 0.6$; and 0.01 mass % to 0.1 mass % inclusive of at least one kind selected from the group consisting of sodium (Na) and potassium (K) in the form of oxide ($Na_2O$, $K_2O$) per 1 mol of the main component as other sub-component.

5. A piezoelectric ceramic, comprising:

an oxide represented by Chemical Formula 2:

$(Pb_{A-B}Me_B)[(Mg_{1/3}Nb_{2/3})_a(Zn_{1/3}Nb_{2/3})_bTi_cZr_d]O_3$ as a main component, wherein the values of A, B, a, b, c and d satisfy each of a+b+c+d=1, $0.99 \leq A \leq 1.01$, $0.005 \leq B \leq 0.1$, $0.15 \leq a+b \leq 0.5$, $0.05 \leq b \leq 0.25$, $0.2 \leq c \leq 0.5$, and $0.15 \leq d \leq 0.6$, Me represents at least one element selected from the group consisting of calcium, strontium and barium; and 0.01 mass % to 0.8 mass % inclusive of at least one kind selected from the group consisting of iron (Fe), cobalt (Co), nickel (Ni) and copper (Cu) in the form of oxide ($Fe_2O_3$, CoO, NiO, CuO) per 1 mol of the main component as a first sub-component.

6. A piezoelectric ceramic according to claim 5, further comprising:

0.05 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component as a second sub-component.

7. A piezoelectric ceramic according to claim 6, further comprising:

0.01 mass % to 0.1 mass % inclusive of at least one kind selected from the group consisting of sodium (Na) and potassium (K) in the form of oxide ($Na_2O$, $K_2O$) per 1 mol of the main component as a third sub-component.

8. A piezoelectric ceramic according to claim 5, further comprising:

0.01 mass % to 0.1 mass % inclusive of at least one kind selected from the group consisting of sodium (Na) and potassium (K) in the form of oxide ($Na_2O$, $K_2O$) per 1 mol of the main component as other sub-component.

9. A method of manufacturing a piezoelectric ceramic, comprising the step of:

pressing and firing a mixture of elements constituting a main component represented by Chemical Formula 1:

$Pb_A[(Mg_{1/3}Nb_{2/3})_a(Zn_{1/3}Nb_{2/3})_bTi_cZr_d]O_3$, wherein the values of A, a, b, c and d satisfy each of a+b+c+d=1, $0.99 \leq A \leq 1.01$, $0.15 \leq a+b \leq 0.5$, $0.05 \leq b \leq 0.25$, $0.2 \leq c \leq 0.5$, and $0.15 \leq d \leq 0.6$; and 0.01 mass % to 0.8 mass % inclusive of at least one kind selected from the group consisting of iron (Fe) and nickel (Ni) in the form of oxide ($Fe_2O_3$, NiO) per 1 mol of the main component as a first sub-component.

10. A method of manufacturing a piezoelectric ceramic according to claim 9, wherein pre-fired powder containing the main component and the first sub-component are pressed and fired.

11. A method of manufacturing a piezoelectric ceramic, comprising the step of:

pressing and firing a mixture containing elements constituting a main component represented by Chemical Formula 1:

$Pb_A[(Mg_{1/3}Nb_{2/3})_a(Zn_{1/3}Nb_{2/3})_bTi_cZr_d]O_3$ as the main component, wherein the values of A, a, b, c and d satisfy each of a+b+c+d=1, $0.99 \leq A \leq 1.01$, $0.15 \leq a+b \leq 0.5$, $0.05 \leq b \leq 0.25$, $0.2 \leq c \leq 0.5$, and $0.15 \leq d \leq 0.6$;

a first sub-component; and a second sub-component;

wherein the first sub-component is 0.01 mass % to 0.8 mass %, inclusive, of at least one kind selected from the group consisting of iron (Fe), cobalt (Co), nickel (Ni) and copper (Cu) in the form of oxide ($Fe_2O_3$, CoO, NiO, CuO) per 1 mol of the main component; and wherein the second sub-component is 0.05 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component.

12. A method of manufacturing a piezoelectric ceramic according to claim 11, wherein pre-fired powder containing the main component, the first sub-component and the second sub-component are pressed and fired.

13. A method of manufacturing a piezoelectric ceramic, comprising the step of:

pressing and firing a mixture of elements constituting a main component represented by Chemical Formula 2:

$(Pb_{A-B}Me_B)[(Mg_{1/3}Nb_{2/3})_a(Zn_{1/3}Nb_{2/3})_bTi_cZr_d]O_3$, wherein the values of A, B, a, b, c and d satisfy each of a+b+c+d=1, $0.99 \leq A \leq 1.01$, $0.005 \leq B \leq 0.1$, $0.15 \leq a+b \leq 0.5$, $0.05 \leq b \leq 0.25$, $0.2 \leq c \leq 0.5$, and $0.15 \leq d \leq 0.6$, Me represents at least one element selected from the group consisting of calcium, strontium and barium; and 0.01 mass % to 0.8 mass % inclusive of at least one kind selected from the group consisting of iron (Fe), cobalt (Co), nickel (Ni) and copper (Cu) in the form of oxide ($Fe_2O_3$, CoO, NiO, CuO) per 1 mol of the main component as a first sub-component.

14. A method of manufacturing a piezoelectric ceramic according to claim 13, wherein pre-fired powder containing the main component and the first sub-component are pressed and fired.

15. A method of manufacturing a piezoelectric ceramic according to claim 13, further comprising the step of:

adding 0.05 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component as a second sub-component to the mixture.

16. A method of manufacturing a piezoelectric ceramic according to claim 15, wherein pre-fired powder containing the main component, the first sub-component and the second sub-component are pressed and fired.

17. A method of manufacturing a piezoelectric ceramic, comprising the steps of:

pressing and firing a mixture containing elements constituting a main component represented by Chemical Formula 1:

$Pb_A[(Mg_{1/3}Nb_{2/3})_a(Zn_{1/3}Nb_{2/3})_b Ti_c Zr_d]O_3$ as the main component, wherein the values of A, a, b, c and d satisfy each of a+b+c+d=1, $0.99 \leq A \leq 1.01$, $0.15 \leq a+b \leq 0.5$, $0.05 \leq b \leq 0.25$, $0.2 \leq c \leq 0.5$, and $0.15 \leq d \leq 0.6$;

a first sub-component; and an other sub-component:

wherein the first sub-component is 0.01 mass % to 0.8 mass %, inclusive, of at least one kind selected from the group consisting of iron (Fe), cobalt (Co), nickel (Ni) and copper (Cu) in the form of oxide ($Fe_2O_3$, CoO, NiO, CuO) per 1 mol of the main component; and wherein the other sub-component is 0.01 mass % to 0.1 mass %, inclusive, of at least one kind selected from the group consisting of sodium (Na) and potassium (K) in the form of oxide ($Na_2O$, $K_2O$) per 1 mol of the main component; and wherein the method further comprises, prior to the pressing and firing, pre-firing a mixture containing at least the elements constituting a main component and the other sub-component.

18. A piezoelectric device, comprising a piezoelectric ceramic according to claim 1.

19. A piezoelectric ceramic comprising:

an oxide represented by Chemical Formula 5:

$Pb_A[(Co_{1/3}Nb_{2/3})_a(Zn_{1/3}Nb_{2/3})Ti_c Zr_d]_B O_3$ as a main component, wherein the values of A, B, a, b, c and d satisfy each of a+b+c+d=1, $0.99 \leq A/B \leq 1.005$, $0.005 \leq a \leq 0.03$, $0.05 \leq b \leq 0.2$, $0.36 \leq c \leq 0.49$, and $0.39 \leq d \leq 0.48$; and 0.1 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component as a sub-component.

20. A piezoelectric device, comprising a piezoelectric ceramic according to claim 19.

21. A piezoelectric ceramic comprising:

an oxide represented by Chemical Formula 3:

$Pb_A(Zn_{1/3}Nb_{2/3})_a Ti_b Zr_c]O_3$ as a main component, wherein the values of A, a, b and c satisfy each of a+b+c=1, $0.99 \leq A \leq 1.005$, $0.005 \leq a \leq 0.25$, $0.35 \leq b \leq 0.50$, and $0.38 \leq c \leq 0.48$;

0.01 mass % to 0.8 mass % inclusive of at least one kind selected from the group consisting of iron (Fe), cobalt (Co), nickel (Ni) and copper (Cu) in the form of oxide ($Fe_2O_3$, CoO, NiO, CuO) per 1 mol of the main component as a first sub-component; and 0.1 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component as a second sub-component.

22. A piezoelectric ceramic comprising:

an oxide represented by Chemical Formula 4:

$(Pb_{A-B}Me_B)[(Zn_{1/3}Nb_{2/3})_a Ti_b Zr_c]O_3$ as a main component, wherein the values of A, B, a, b and c satisfy each of a+b+c=1, $0.99 \leq A \leq 1.005$, $0.05 \leq B \leq 0.1$, $0.05 \leq a \leq 0.25$, $0.35 \leq b \leq 0.50$, and $0.38 \leq c \leq 0.48$, Me represents at least one element selected from the group consisting of calcium, strontium and barium;

0.01 mass % to 0.8 mass % inclusive of at least one kind selected from the group consisting of iron (Fe), cobalt (Co), nickel (Ni) and copper (Cu) in the form of oxide ($Fe_2O_3$, CoO, NiO, CuO) per 1 mol of the main component as a first sub-component; and 0.1 mass % to 1.0 mass % inclusive of at least one kind selected from the group consisting of antimony (Sb), niobium (Nb) and tantalum (Ta) in the form of oxide ($Sb_2O_3$, $Nb_2O_5$, $Ta_2O_5$) per 1 mol of the main component as a second sub-component.

23. A piezoelectric device, comprising a piezoelectric ceramic according to claim 21.

24. A method of manufacturing a piezoelectric ceramic according to claim 13, further comprising the step of:

preparing pre-fired powder containing the main component and 0.01 mass % to 0.1 mass %, inclusive, of at least one kind selected from the group consisting of sodium (Na) and potassium (K) in the form of oxide ($Na_2O$, $K_2O$) per 1 mol of the main component as other sub-component.

25. A piezoelectric device, comprising a piezoelectric ceramic according to claim 2.

26. A piezoelectric device, comprising a piezoelectric ceramic according to claim 4.

27. A piezoelectric device, comprising a piezoelectric ceramic according to claim 5.

28. A piezoelectric device, comprising a piezoelectric ceramic according to claim 22.

* * * * *